(12) United States Patent
Liu et al.

(10) Patent No.: US 11,532,485 B2
(45) Date of Patent: Dec. 20, 2022

(54) PROCESS FOR MAKING MULTI-GATE TRANSISTORS AND RESULTING STRUCTURES

(71) Applicant: Taiwan Semiconductor Manufacturing Co., Ltd., Hsinchu (TW)

(72) Inventors: Su-Hao Liu, Jhongpu Township (TW); Tsan-Chun Wang, Hsinchu (TW); Liang-Yin Chen, Hsinchu (TW); Jing-Huei Huang, Yuanshan Township (TW); Lun-Kuang Tan, Hsinchu (TW); Huicheng Chang, Tainan (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 117 days.

(21) Appl. No.: 17/107,558

(22) Filed: Nov. 30, 2020

(65) Prior Publication Data

US 2021/0111035 A1 Apr. 15, 2021

Related U.S. Application Data

(60) Division of application No. 16/518,505, filed on Jul. 22, 2019, now Pat. No. 10,854,471, which is a
(Continued)

(51) Int. Cl.
*H01L 21/31* (2006.01)
*H01L 21/3115* (2006.01)
(Continued)

(52) U.S. Cl.
CPC .. *H01L 21/31155* (2013.01); *H01L 21/31105* (2013.01); *H01L 21/823821* (2013.01);
(Continued)

(58) Field of Classification Search
None
See application file for complete search history.

(56) References Cited

U.S. PATENT DOCUMENTS 8,546,209 B1 10/2013 Cheng et al.
9,190,481 B2 11/2015 Zhao
(Continued)

FOREIGN PATENT DOCUMENTS

CN 104795331 A 7/2015
CN 105225950 A 1/2016

*Primary Examiner* — Joseph C. Nicely
*Assistant Examiner* — Lamont B Koo
(74) *Attorney, Agent, or Firm* — Slater Matsil, LLP

(57) ABSTRACT

In a gate last metal gate process for forming a transistor, a dielectric layer is formed over an intermediate transistor structure, the intermediate structure including a dummy gate electrode, typically formed of polysilicon. Various processes, such as patterning the polysilicon, planarizing top layers of the structure, and the like can remove top portions of the dielectric layer, which can result in decreased control of gate height when a metal gate is formed in place of the dummy gate electrode, decreased control of fin height for finFETs, and the like. Increasing the resistance of the dielectric layer to attack from these processes, such as by implanting silicon or the like into the dielectric layer before such other processes are performed, results in less removal of the top surface, and hence improved control of the resulting structure dimensions and performance.

20 Claims, 29 Drawing Sheets

Related U.S. Application Data continuation of application No. 16/050,148, filed on Jul. 31, 2018, now Pat. No. 10,361,094, which is a division of application No. 15/441,063, filed on Feb. 23, 2017, now Pat. No. 10,177,006.

(60) Provisional application No. 62/428,447, filed on Nov. 30, 2016.

(51) Int. Cl.
*H01L 27/092* (2006.01)
*H01L 29/78* (2006.01)
*H01L 21/8238* (2006.01)
*H01L 21/311* (2006.01)
*H01L 29/66* (2006.01)
*H01L 21/8234* (2006.01)
*H01L 27/088* (2006.01)

(52) U.S. Cl.
CPC .... *H01L 27/0924* (2013.01); *H01L 29/66545* (2013.01); *H01L 29/66795* (2013.01); *H01L 29/7853* (2013.01); *H01L 21/823431* (2013.01); *H01L 27/0886* (2013.01)

(56) References Cited

U.S. PATENT DOCUMENTS

| | | |
|---|---|---|
| 2005/0118808 A1 | 6/2005 | Liu et al. |
| 2013/0115773 A1 | 5/2013 | Pal et al. |
| 2013/0288468 A1 | 10/2013 | Chi |
| 2013/0288471 A1 | 10/2013 | Chi |
| 2013/0334580 A1 | 12/2013 | Cheng et al. |
| 2014/0117418 A1 | 5/2014 | Flachowsky et al. |
| 2014/0159126 A1 | 6/2014 | Wei et al. |
| 2015/0295089 A1* | 10/2015 | Huang .............. H01L 21/31116 438/283 |
| 2016/0020300 A1 | 1/2016 | Tsai et al. |
| 2016/0079034 A1 | 3/2016 | Meh et al. |
| 2016/0284695 A1 | 9/2016 | Liaw |
| 2016/0329250 A1 | 11/2016 | Ching et al. |
| 2017/0110577 A1 | 4/2017 | Wang et al. |
| 2018/0005869 A1 | 1/2018 | Yu et al. |

* cited by examiner

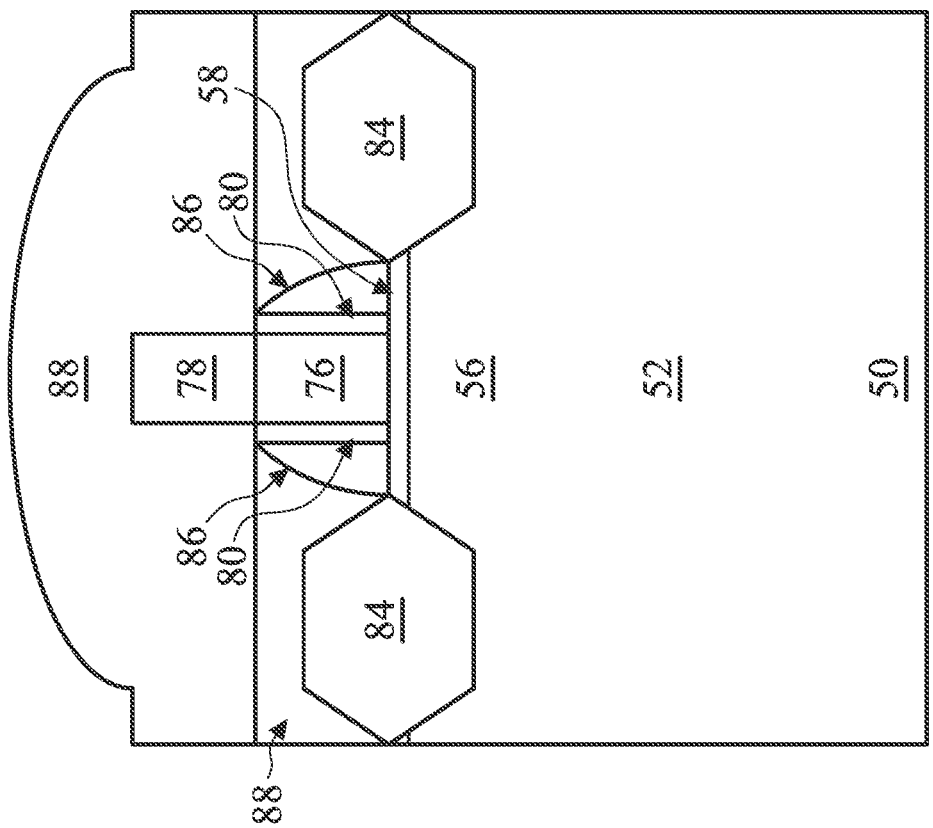
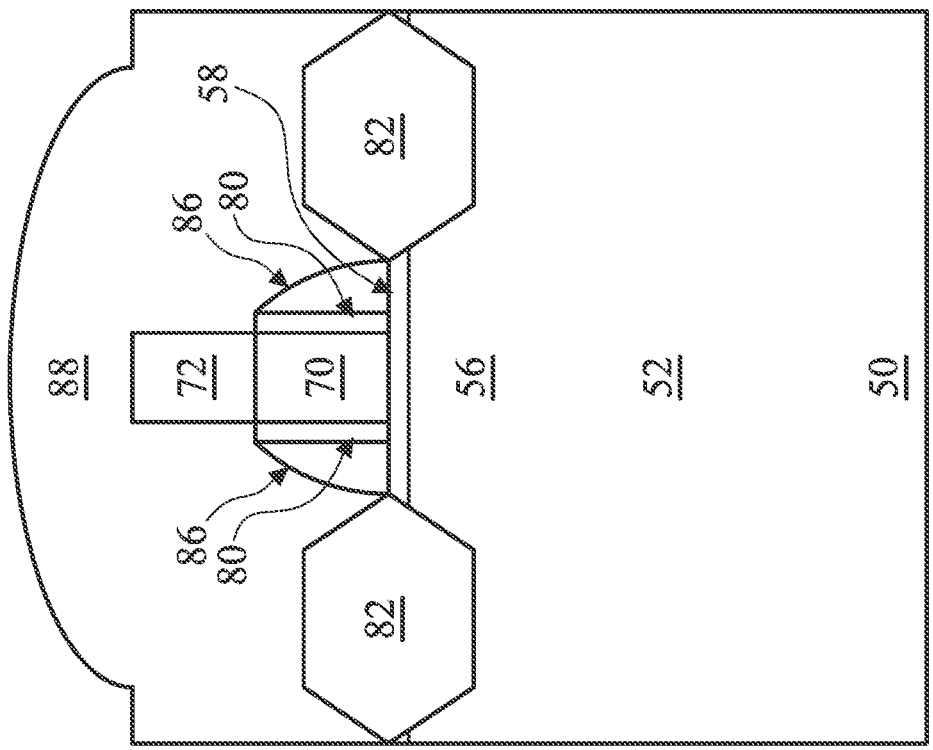
Fig. 10C
Fig. 10B

170 Form an intermediate transistor structure on a substrate, the intermediate transistor structure including a dummy gate structure.

171 Deposit a dielectric layer over the transistor structure and the dummy gate structure.

172 Perform at least one process on the dielectric layer to improve etch resistivity of the dielectric layer relative to a predetermined etch process.

173 Remove the dummy gate structure using the predetermined etch process.

Figure 17

PROCESS FOR MAKING MULTI-GATE TRANSISTORS AND RESULTING STRUCTURES

PRIORITY

This application is a divisional of U.S. patent application Ser. No. 16/518,505, filed on Jul. 22, 2019, (now U.S. Pat. No. 10,854,471, issuing Dec. 1, 2020) and entitled "Process for Making Multi-Gate Transistors and Resulting Structures;" which is a continuation of U.S. patent application Ser. No. 16/050,148, filed on Jul. 31, 2018, (now U.S. Pat. No. 10,361,094, issued Jul. 23, 2019), and entitled "Process for Making Multi-Gate Transistors and Resulting Structures;" which is a divisional of U.S. patent application Ser. No. 15/441,063, filed on Feb. 23, 2017 (now U.S. Pat. No. 10,177,006, issued Jan. 8, 2019), and entitled "Process for Making Multi-Gate Transistors and Resulting Structures;" which application claims the benefit to U.S. Provisional Patent Application No. 62/428,447, filed on Nov. 30, 2016, and entitled "Process for Making Multi-Gate Transistors and Resulting Structures;" which applications are incorporated herein by reference.

BACKGROUND

As integrated circuit dimensions shrink and device densities increase, the need exists for smaller and smaller transistor structure that can be packed more densely while still maintaining acceptable performance levels, even at lower operating voltages and lower power consumption requirements. Such devices include multi-gate transistors such as finFETs. New processes are required to manufacture such devices efficiently and reliably.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 6, 7A-7C, 8A-8C, 9A-9C, 10A-10C, 11A-11C, 12A-12E, 13A-13C, 14A-14C, and 15A-15C are cross-sectional views of intermediate stages in the manufacturing of FinFETs with interconnect structures in accordance with some embodiments.

FIG. 17 is a flow chart illustrating steps of another embodiment process.

DETAILED DESCRIPTION

Figure 1:
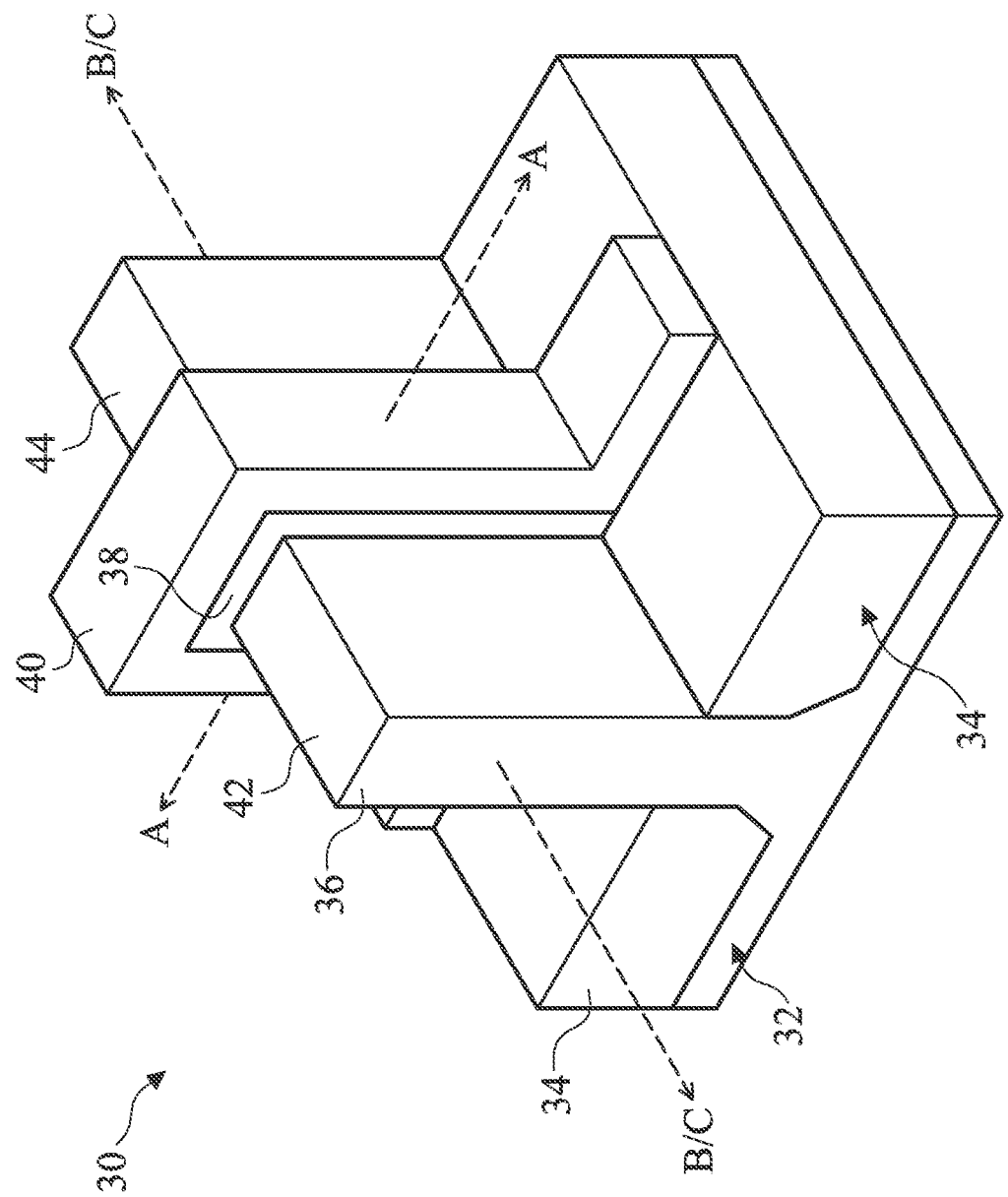
FIG. 1 is an example of a Fin Field-Effect Transistor (FinFET) in a three-dimensional view.

The following disclosure provides many different embodiments, or examples, for implementing different features of the provided subject matter. Specific examples of components, values, operations, materials, arrangements, and the like, are described below to simplify the present disclosure. These are, of course, merely examples and are not intended to be limiting. Other components, values, operations, materials, arrangements, and the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a fin field-effect transistor (FinFET) 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Embodiments discussed herein are discussed in the context of FinFETs formed using a gate-last process. Some embodiments contemplate aspects used in planar devices, such as planar FETs.

FIGS. 2 through 16C are cross-sectional views of intermediate stages in the manufacturing of FinFETs in accordance with an exemplary embodiment. FIGS. 2 through 6 illustrate reference cross-section A-A illustrated in FIG. 1, except for multiple FinFETs. In FIGS. 7A through 16C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
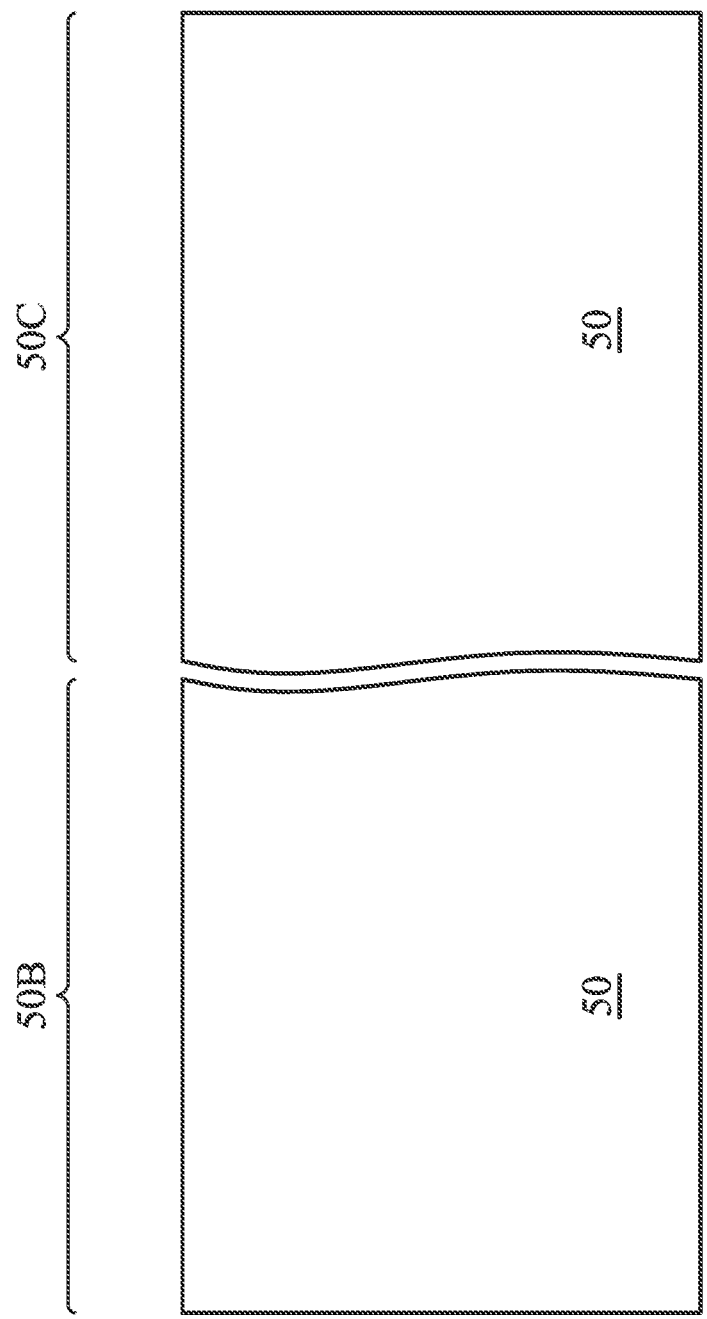

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 3:
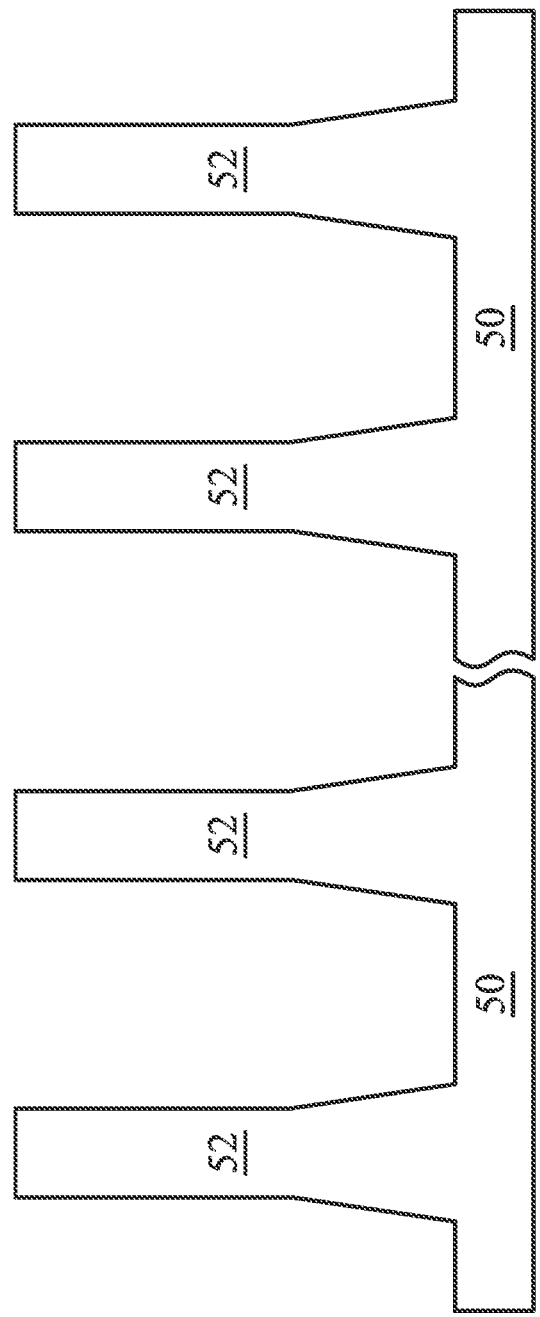
Figure 4:
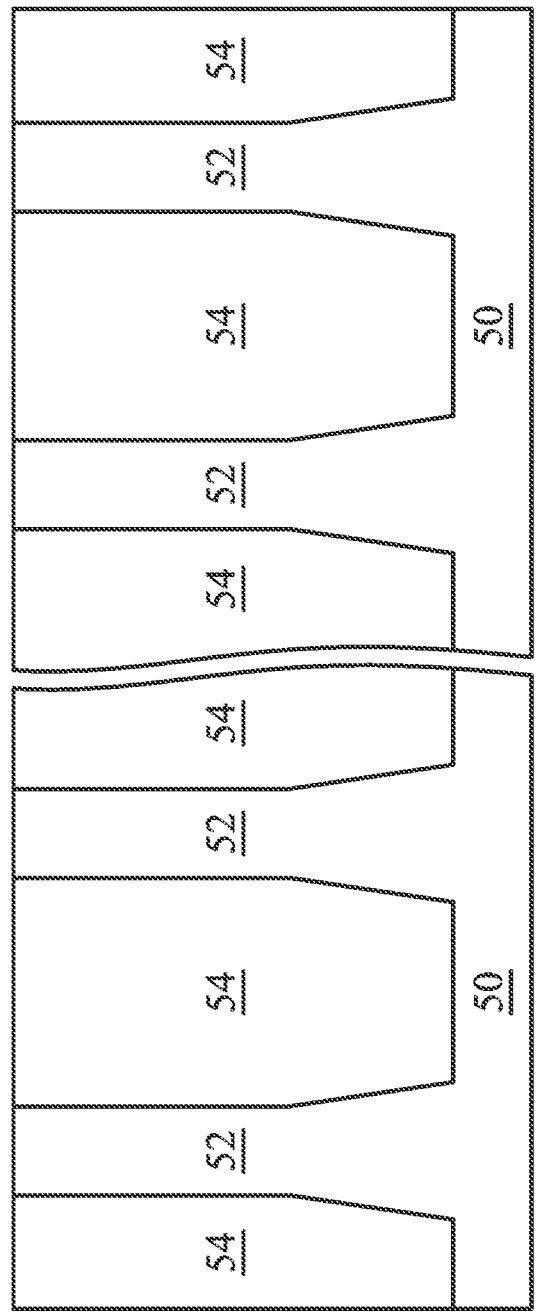

FIGS. 3 and 4 illustrate the formation of fins 52 and isolation regions 54 between neighboring fins 52. In FIG. 3 fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4 an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. As further shown in FIG. 4, a planarization process, such as a chemical mechanical polish (CMP), may remove any excess insulation material 54 and form top surfaces of the isolation regions 54 and top surfaces of the fins 52 that are coplanar.

Figure 5:
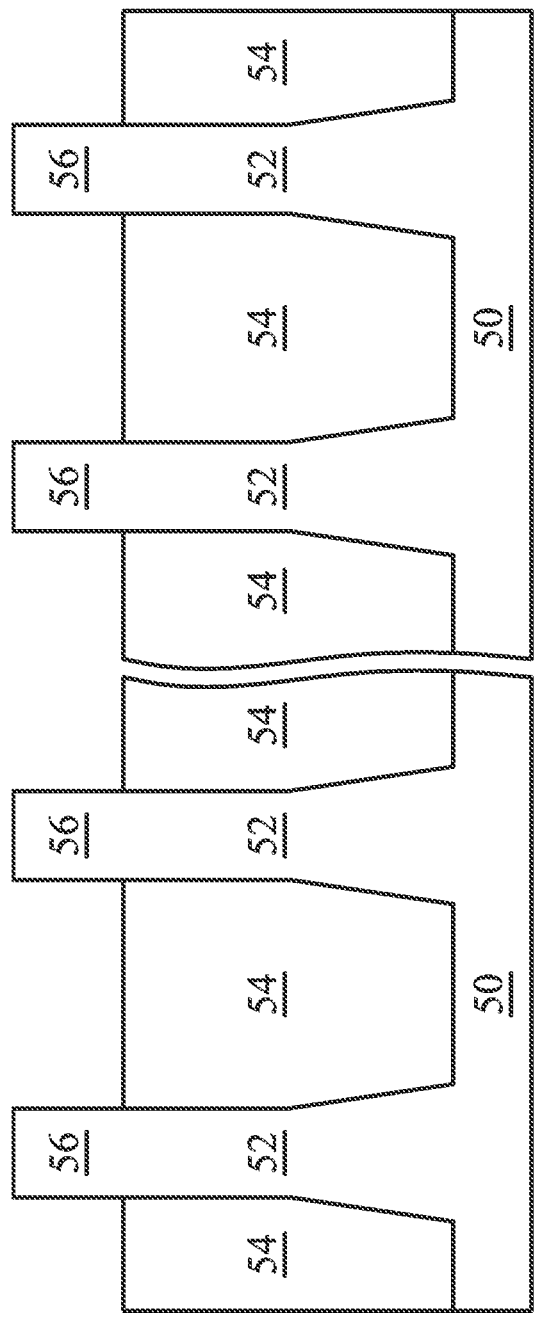

FIG. 5 illustrates the recessing of the isolation regions 54 to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CER-TAS® etch or an Applied Materials SICONI tool using, e.g., dilute hydrofluoric (dHF) acid may be used.

A person having ordinary skill in the art will readily understand that the process described with respect to FIGS. 3 through 6 is just one example of how fins 56 may be formed. In other embodiments, a dielectric layer can be formed over a top surface of the substrate 50; trenches can be etched through the dielectric layer; homo-epitaxial structures can be epitaxially grown in the trenches; and the dielectric layer can be recessed such that the homo-epitaxial structures protrude from the dielectric layer to form fins. In still other embodiments, hetero-epitaxial structures can be used for the fins. For example, the semiconductor strips 52 in FIG. 5 can be recessed, and a material different from the semiconductor strips 52 may be epitaxially grown in their place. In an even further embodiment, a dielectric layer can be formed over a top surface of the substrate 50; trenches can be etched through the dielectric layer; hetero-epitaxial structures can be epitaxially grown in the trenches using a material different from the substrate 50; and the dielectric layer can be recessed such that the hetero-epitaxial structures protrude from the dielectric layer to form fins 56. In some embodiments where homo-epitaxial or hetero-epitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 5, appropriate wells (not shown) may be formed in the fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, BF2, or the like implanted in the first region to a concentration of equal to or less than $10^{18}$ cm$^{-3}$, such as in a range from about $10^{17}$ cm$^{-3}$ to about $10^{18}$ cm$^3$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 6:
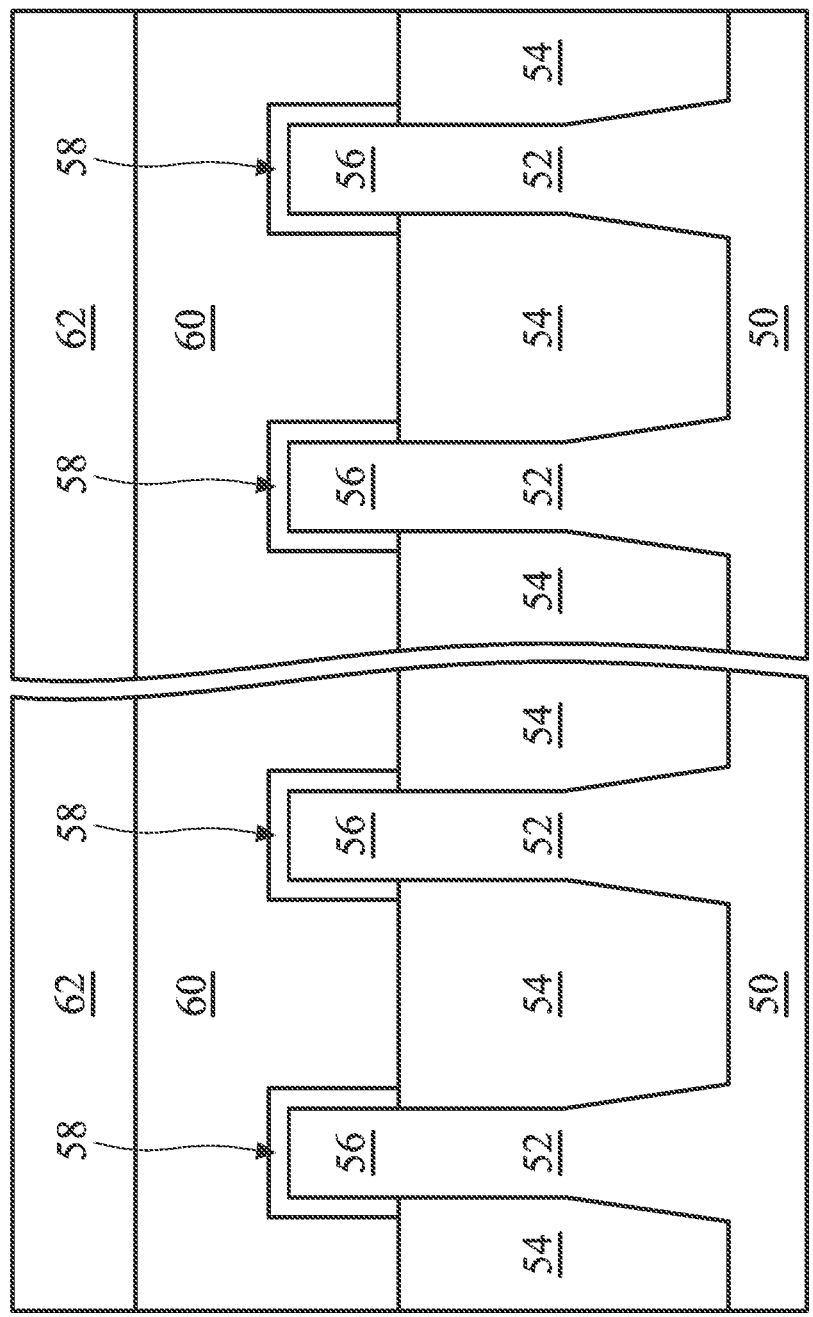

In FIG. 6, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 7A:
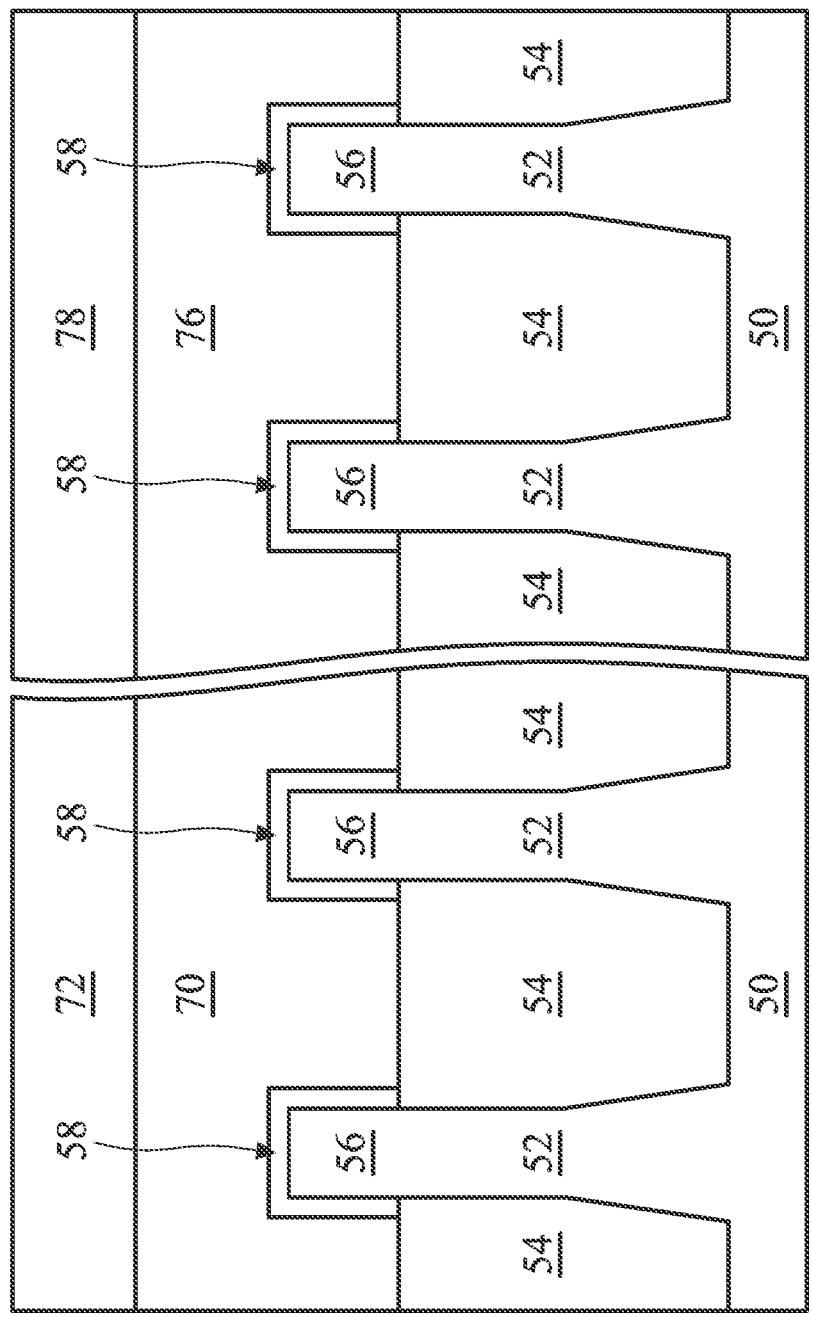
Figure 7C:
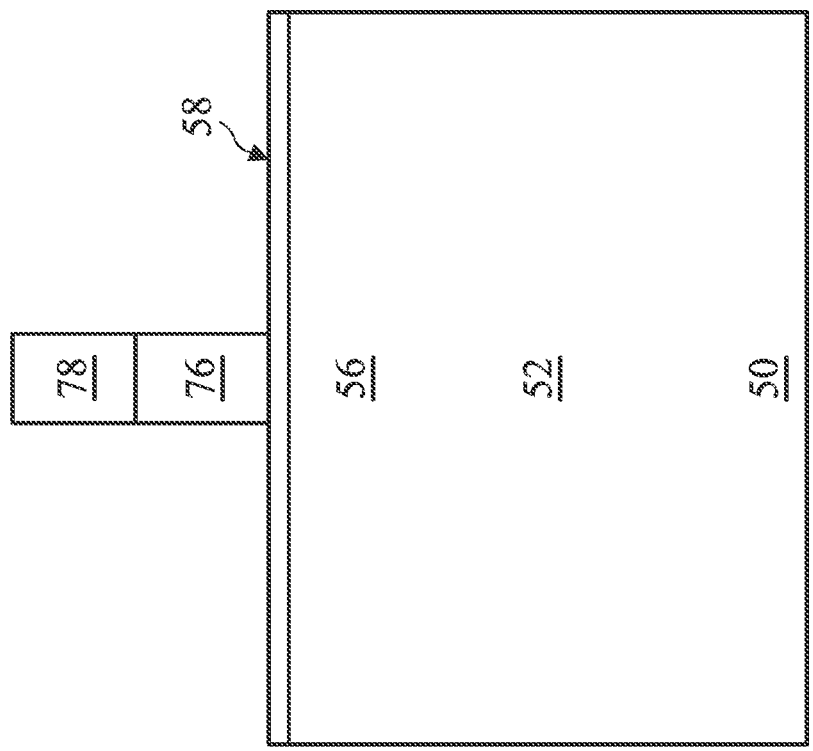
Figure 7B:
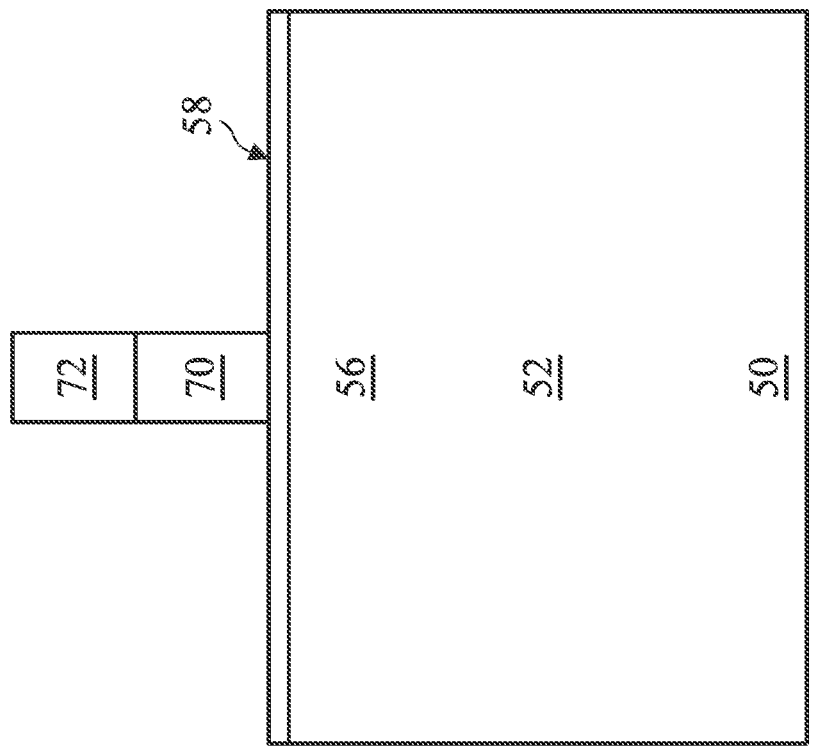

In FIGS. 7A, 7B, and 7C, the mask layer 62 may be patterned using acceptable photolithography and etching techniques to form masks 72 in a first region and masks 78 in a second region. The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 8A:
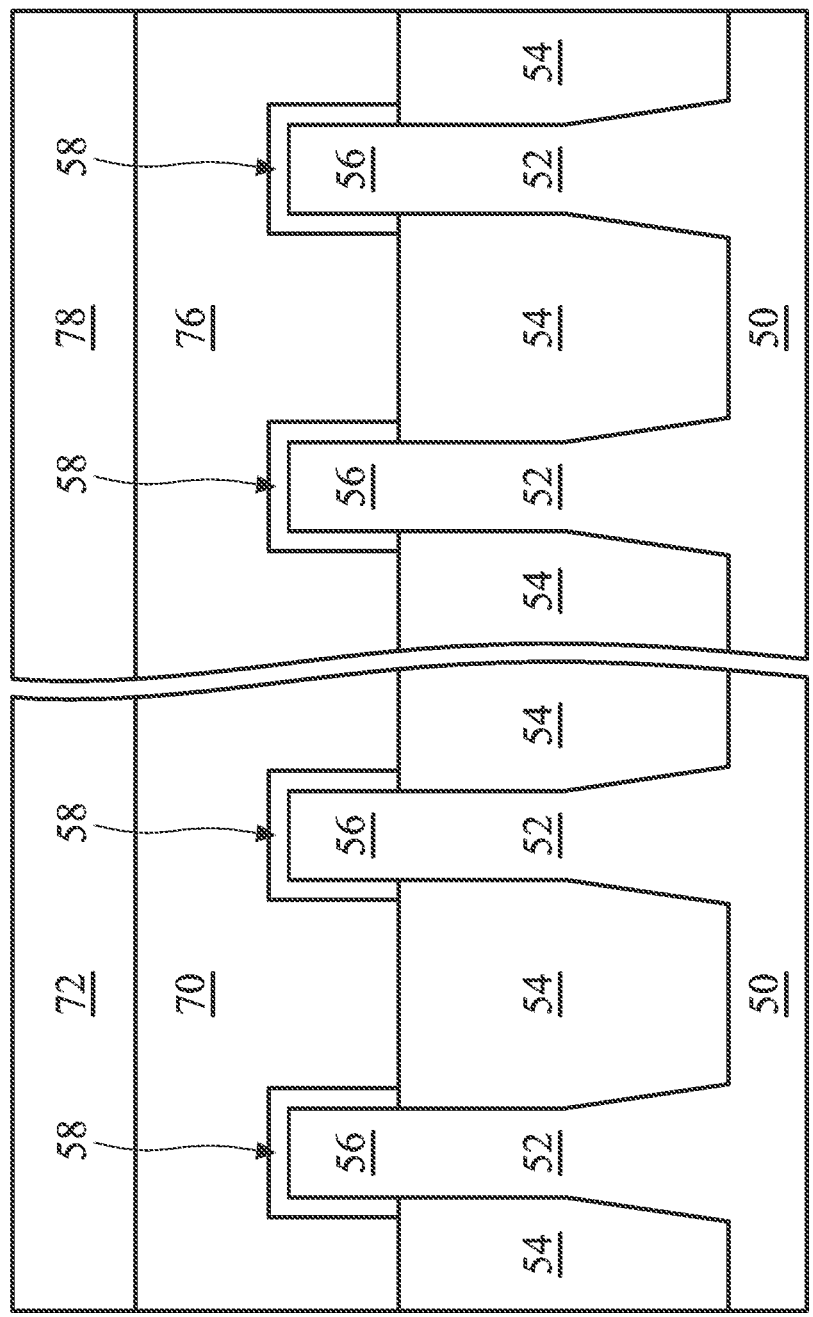
Figure 8C:
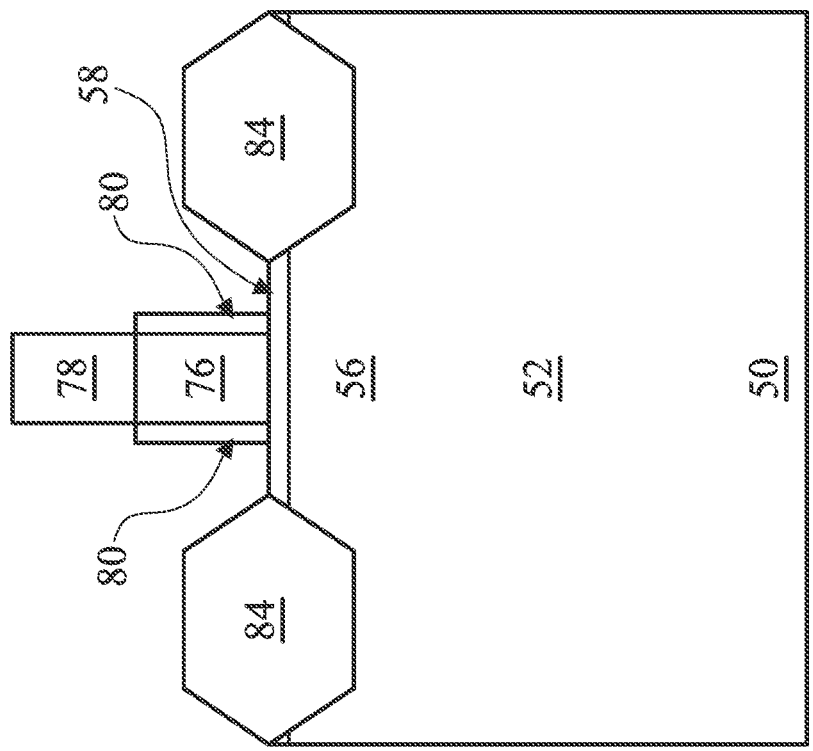
Figure 8B:
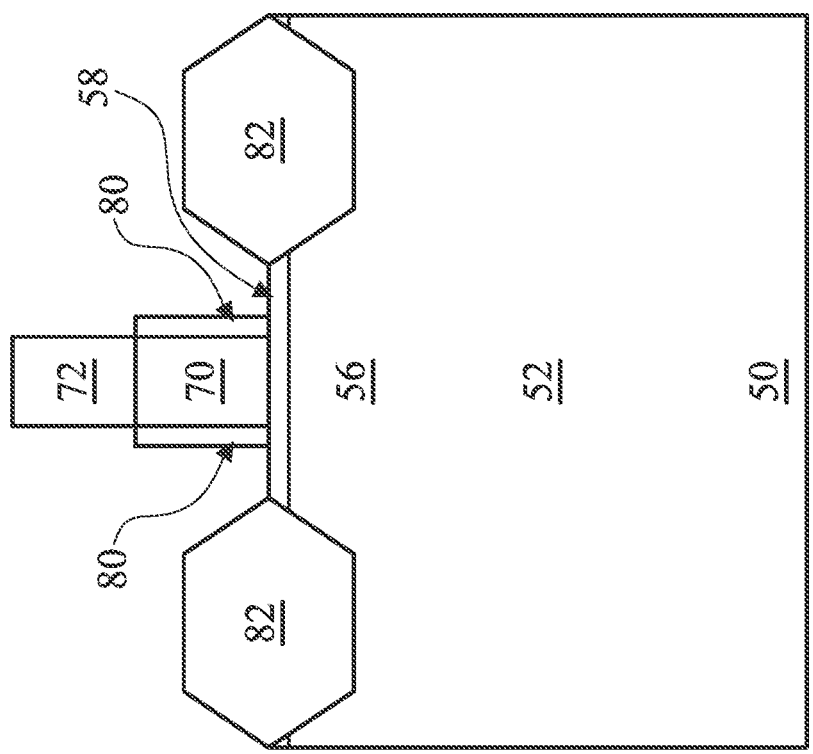

In FIGS. 8A, 8B, and 8C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 5, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{18}$ cm$^{-3}$ to about $10^{19}$ cm$^{-3}$. An anneal may be used to activate the implanted impurities.

Further in FIGS. 8A, 8B, and 8C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 9A:
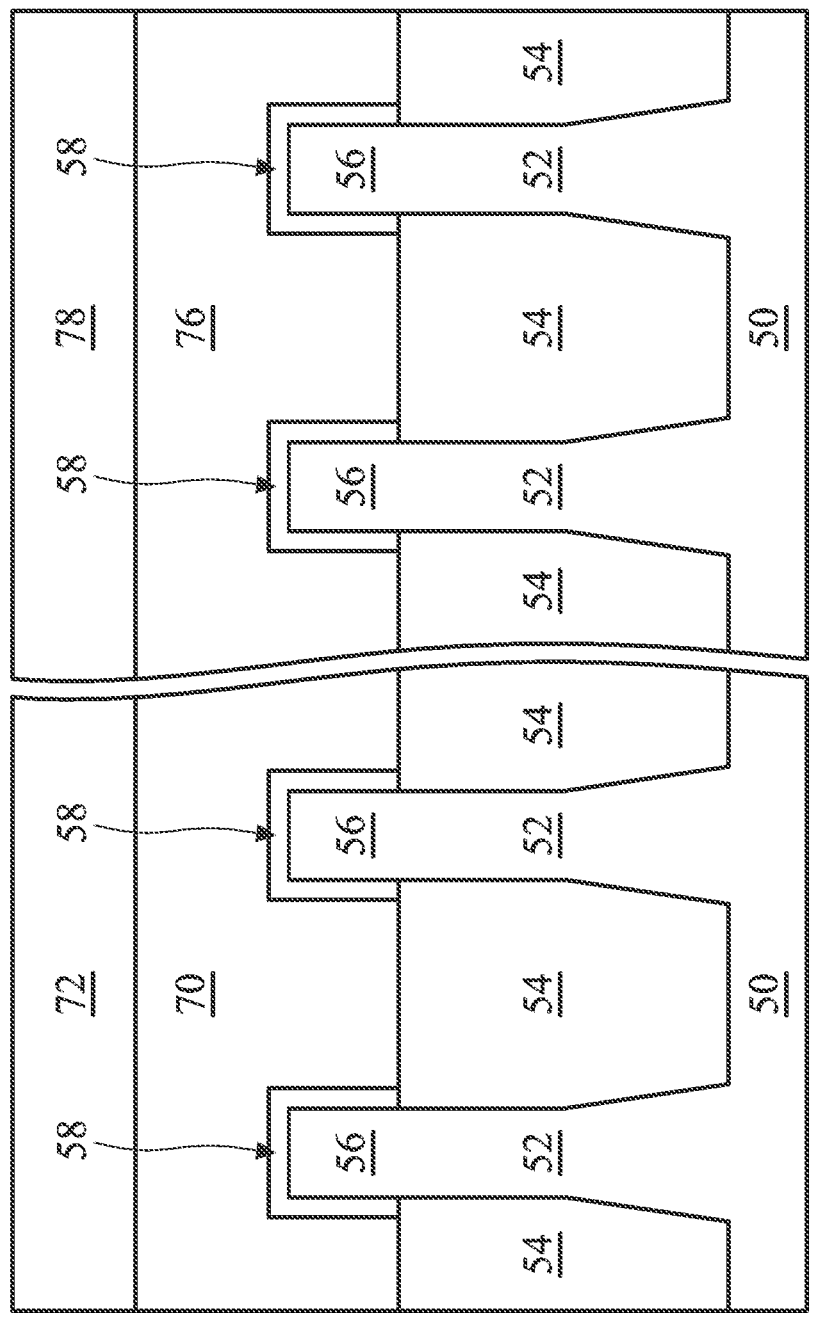
Figure 9C:
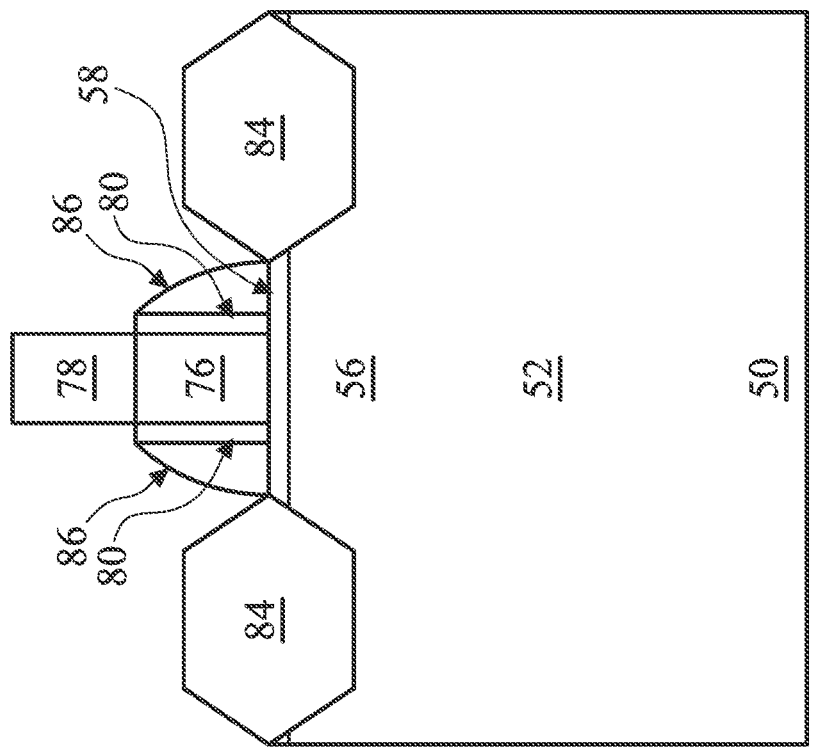
Figure 9B:
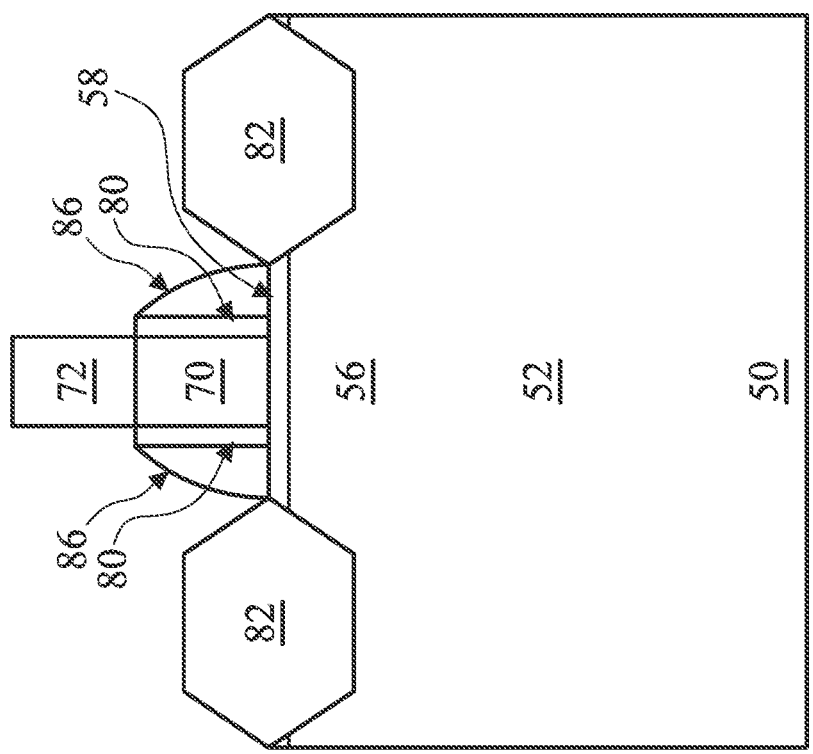

In FIGS. 9A, 9B, and 9C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 10A:
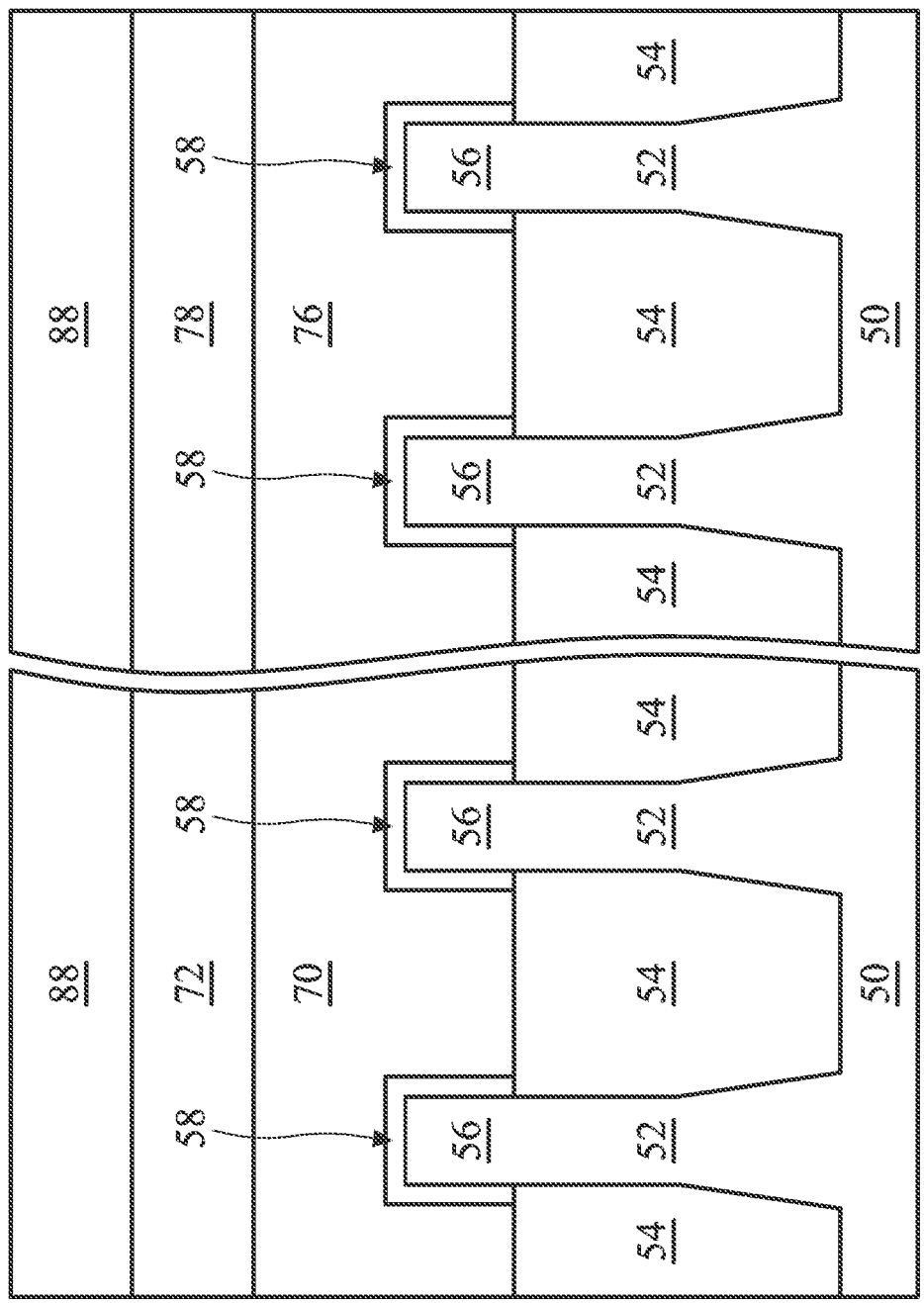

In FIGS. 10A, 10B, and 10C, an ILD 88 is deposited over the structure illustrated in FIGS. 9A, 9B, and 9C. In an embodiment, ILD 88 is a flowable film formed by a flowable CVD. In some embodiments, ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD. In some embodiments, ILD 88 is cured, e.g., by annealing after deposition.

Figure 11A:
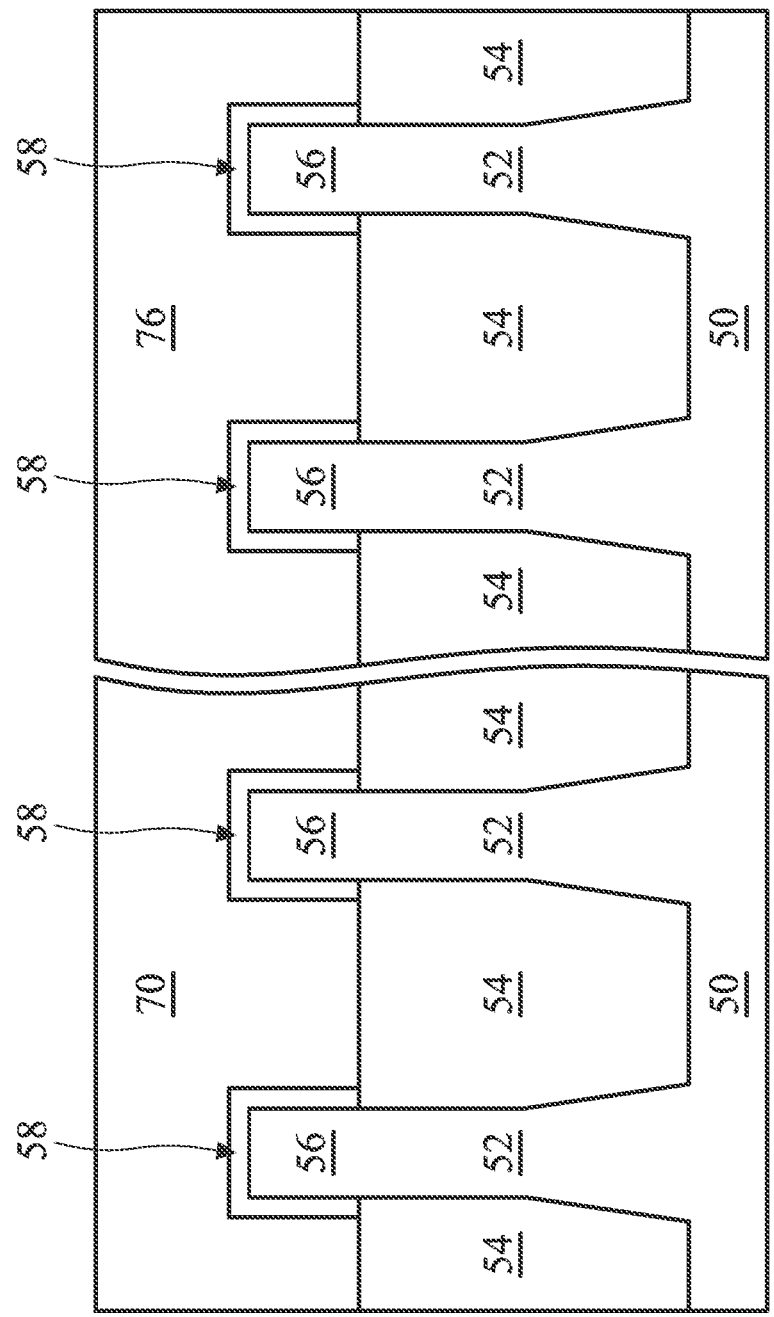
Figure 11C:
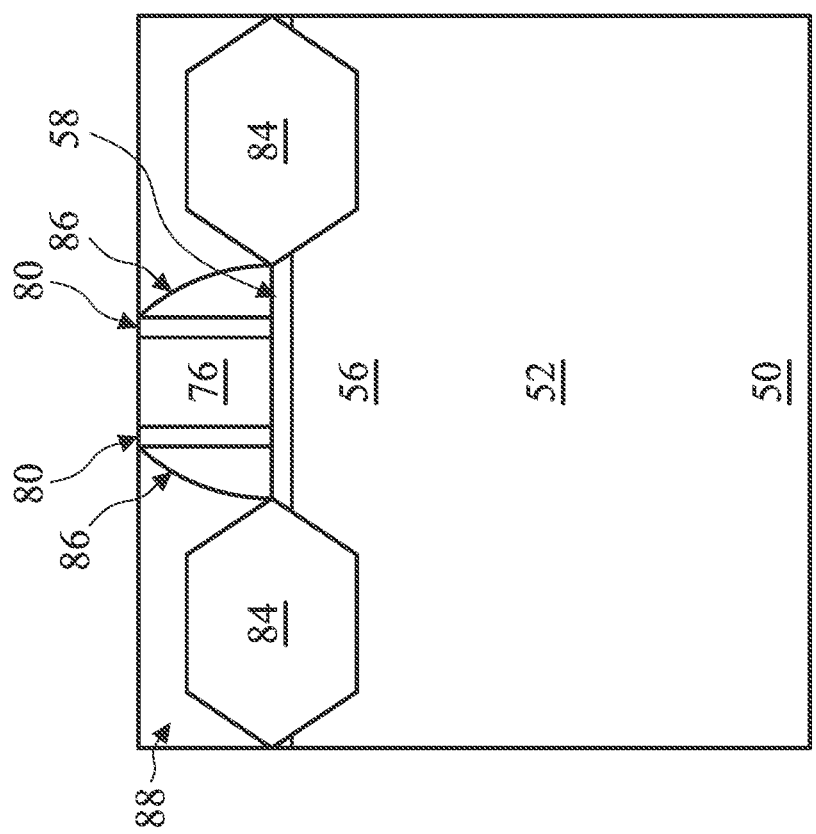
Figure 11B:
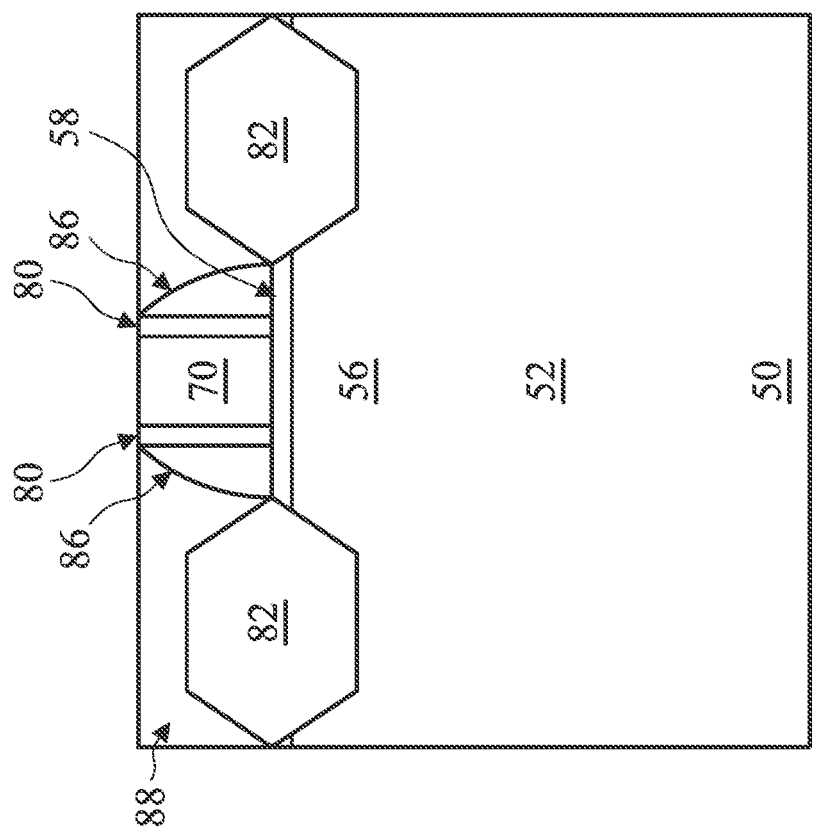

In FIGS. 11A, 11B, and 11C, a planarization process, such as a CMP, may be performed to level the top surface of ILD 88 with the top surfaces of the dummy gates 70 and 76. The CMP may also remove the masks 72 and 78 on the dummy gates 70 and 76. Accordingly, top surfaces of the dummy gates 70 and 76 are exposed through ILD 88. In other embodiments, masks 72 and 78 are removed prior to deposition of ILD 88.

Figure 12A:
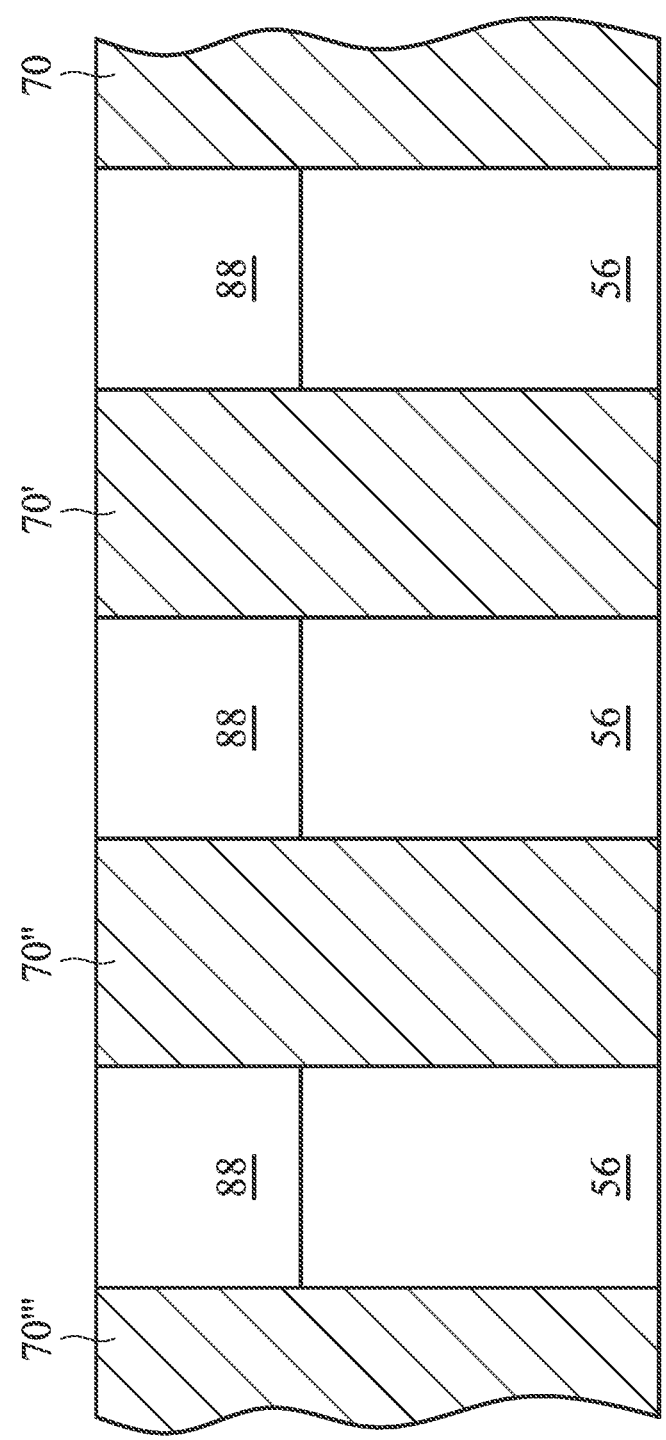

FIG. 12A illustrates in greater detail a top portion of an exemplary fin 56 and ILD 88 along the axis identified as BC-BC (in FIG. 1). This illustrated embodiment corresponds to a fin 56 in region 50B (i.e., a fin in which one or more NMOS transistors will be formed) although the teaching applies equally to fins formed in region 50C (in which PMOS transistors will be formed). Four dummy gates 70 are illustrated (two of which are shown only partially in the partial illustration of FIG. 12). These four dummy gates are notated as 70, 70', 70" and 70'" for clarity. Although FIG. 12A illustrates the structure from a different perspective, it is contemplated that the processes discussed in FIGS. 1-11 are employed to derive the intermediate structure illustrated in FIG. 12A. One skilled in the art will recognize that multiple dummy gates can be formed over a fin; whereas four dummy gates are illustrated in the cut-away of FIG. 12A, as few as one and as many as scores or hundreds of dummy gates could be formed over the fins.

In some embodiments, it is desirable to remove all or a portion of one or more dummy gates, in a process commonly referred to as a cut poly process. This is not the same process as the dummy gate removal step, which will be discussed in greater detail below. Rather, this process involves patterning dummy gate structures, typically formed of polysilicon, to form conductors that will remain on the device even after the remainder of the dummy gate structures have been removed and replaced with metal gates, as described below.

Figure 12B:
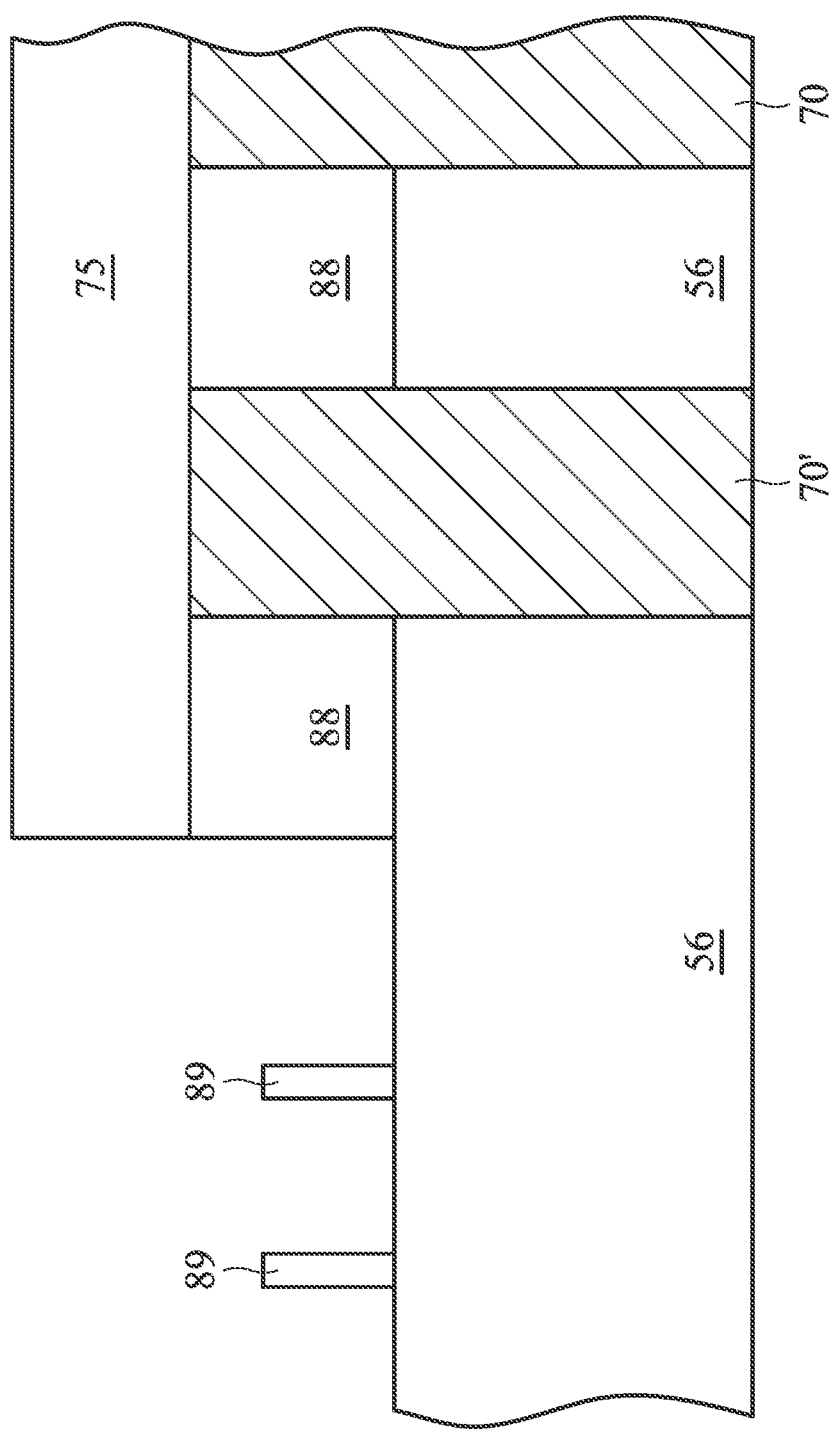
Figure 12C:
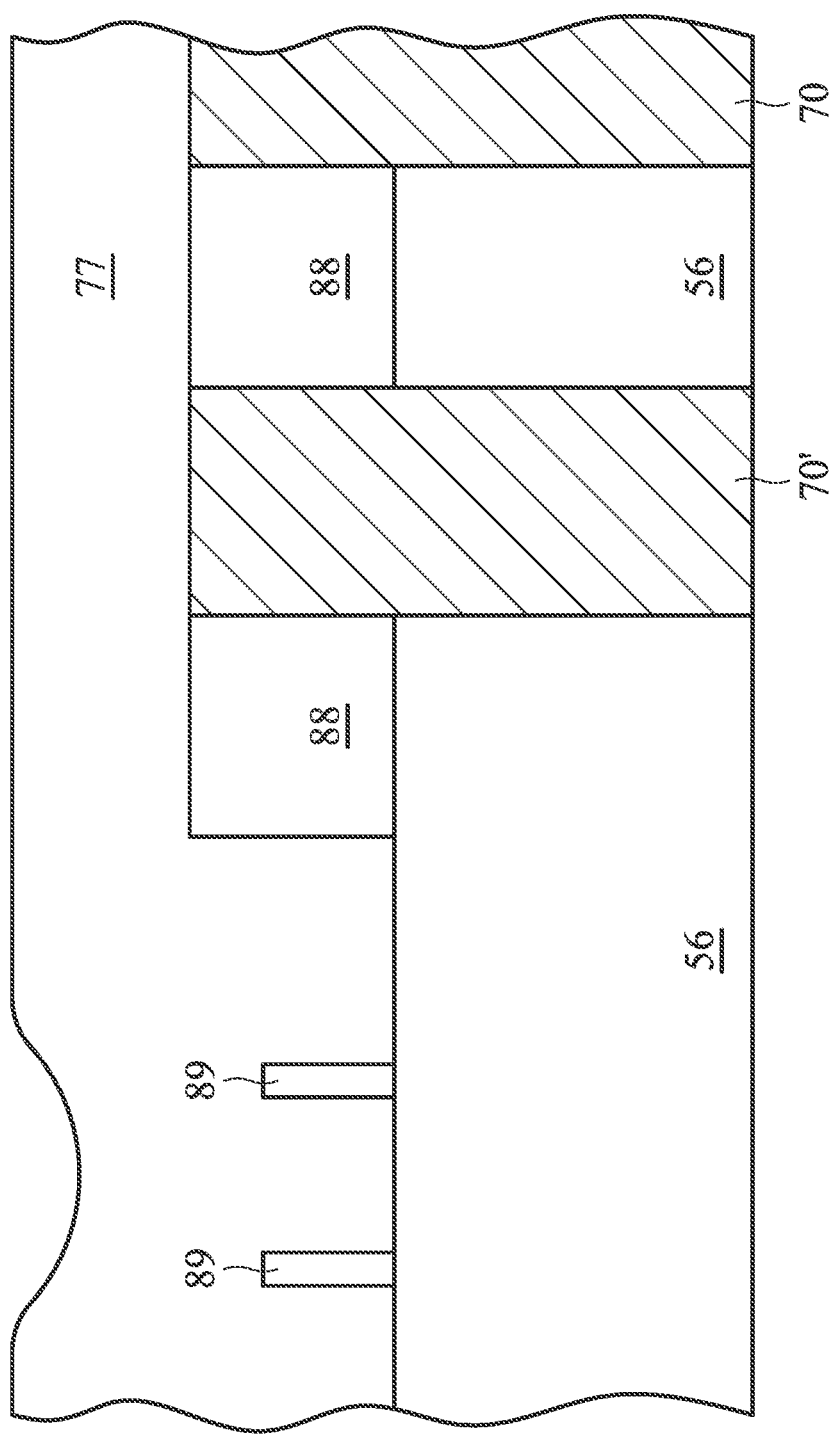
Figure 12D:
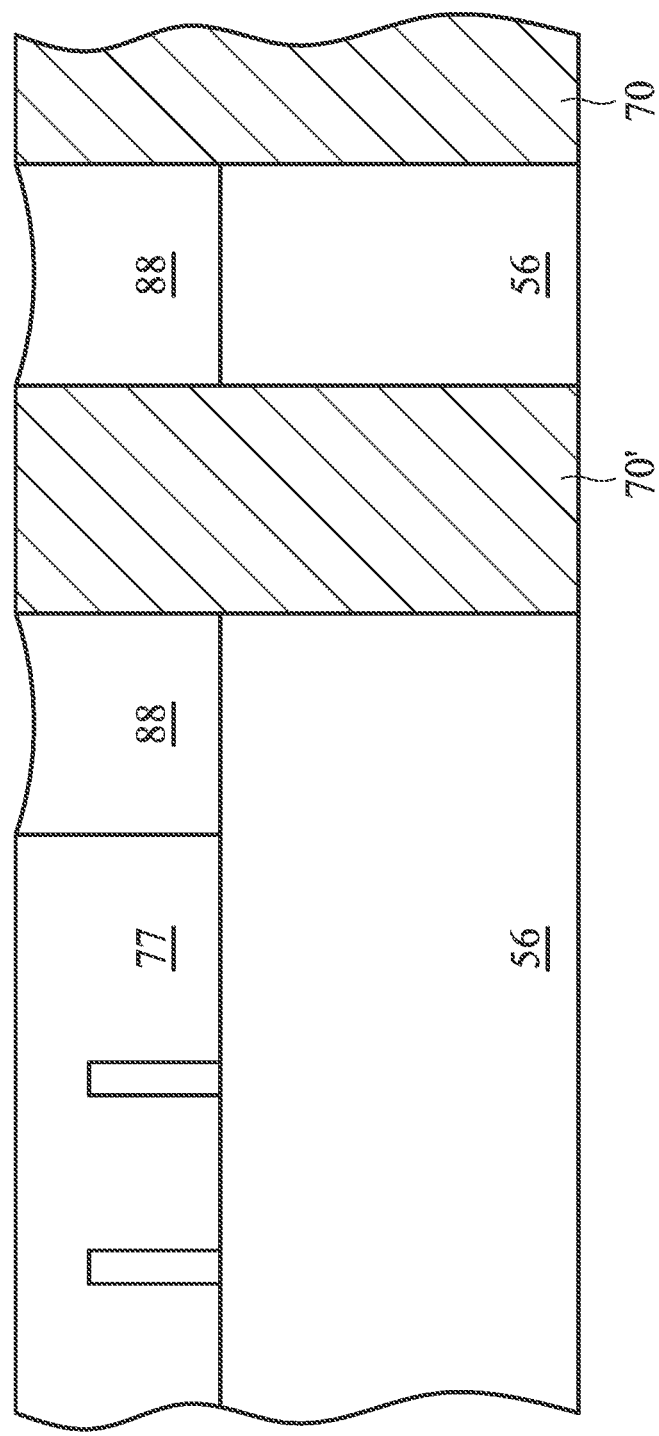

FIG. 12B illustrates the structure after dummy gates 70" and 70'" have been removed. As shown, a mask layer 75 is applied over dummy gates 70 and 70' to protect them and dummy gates 70" and 70'" are removed, e.g., by etching them using a common polysilicon etch process such as a wet etch or a dry etch using an appropriate chemistry, such as TetraMethyl Ammonium. Hydroxide (TMAH), HBr, HF, another halide etchant, or the like, and combinations thereof, as are well known in the art. In some instances, some or all of ILD 88 exposed to the etch process is also removed, although this is not necessary for accomplishing features of the disclosed embodiments. In the embodiment illustrated in FIG. 12B, exposed portions of ILD 88 are etched back, leaving remaining portions 89. In a next step, mask layer 75 is removed and a sacrificial material 77, such as silicon nitride is deposited over the device as shown in FIG. 12C. This sacrificial material 77 fills in the voids left behind by removed dummy gates 70" and 70'". Note that sacrificial material 77 conforms to the topography of the underlying structure and hence does not provide a planar top surface. FIG. 12D illustrates the device after a planarizing process, such as a CMP step, has been performed on sacrificial material 77 to planarize sacrificial material 77 with top surfaces of dummy gates 70 and 70' and ILD 88. Note that the planarization process causes dishing of the top surface of ILD layer 88. This is an undesirable consequence because such dishing can impact the uniformity of gate height and/or fin height in the to-be-form finFET transistor.

Figure 12E:
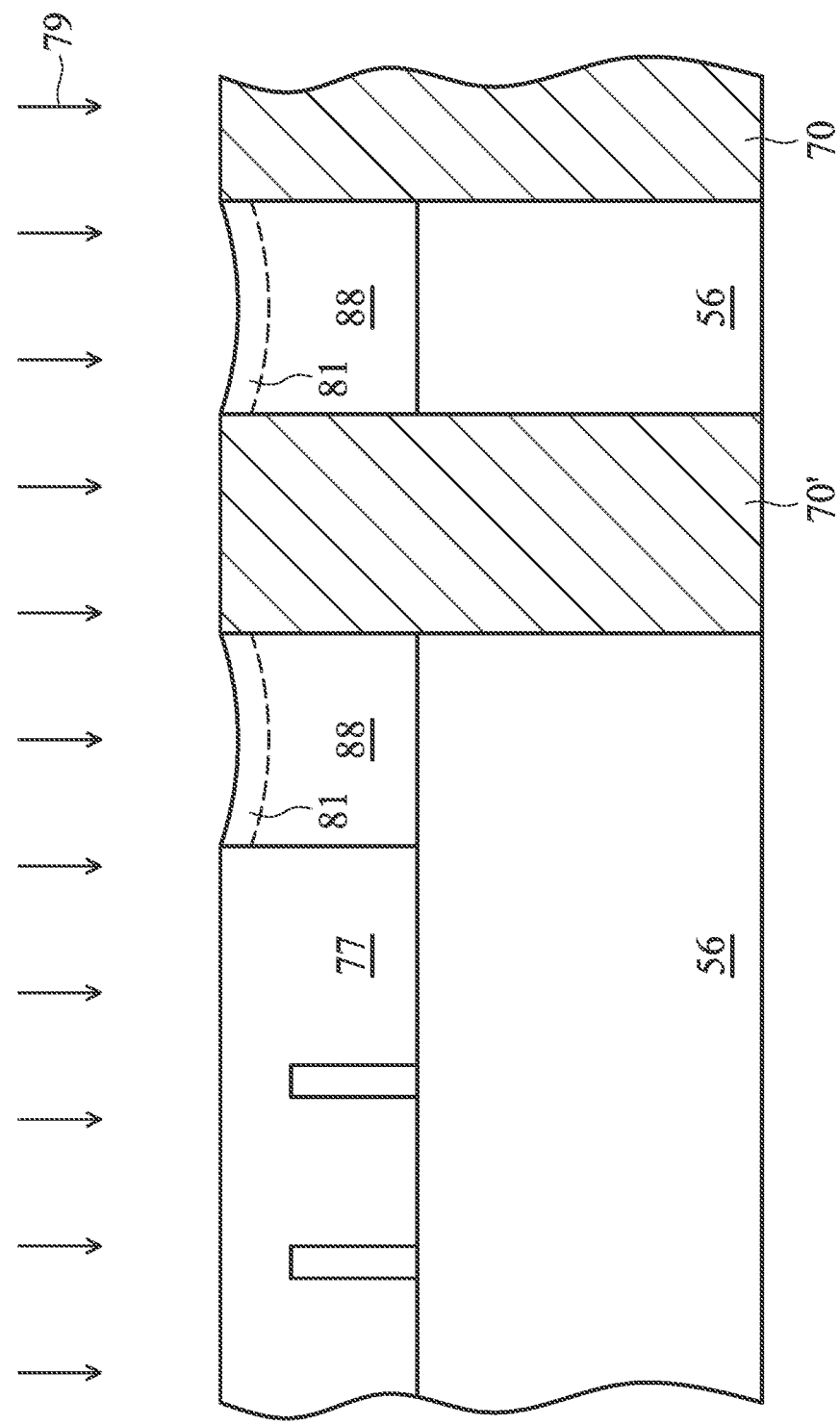
Figure 13A:
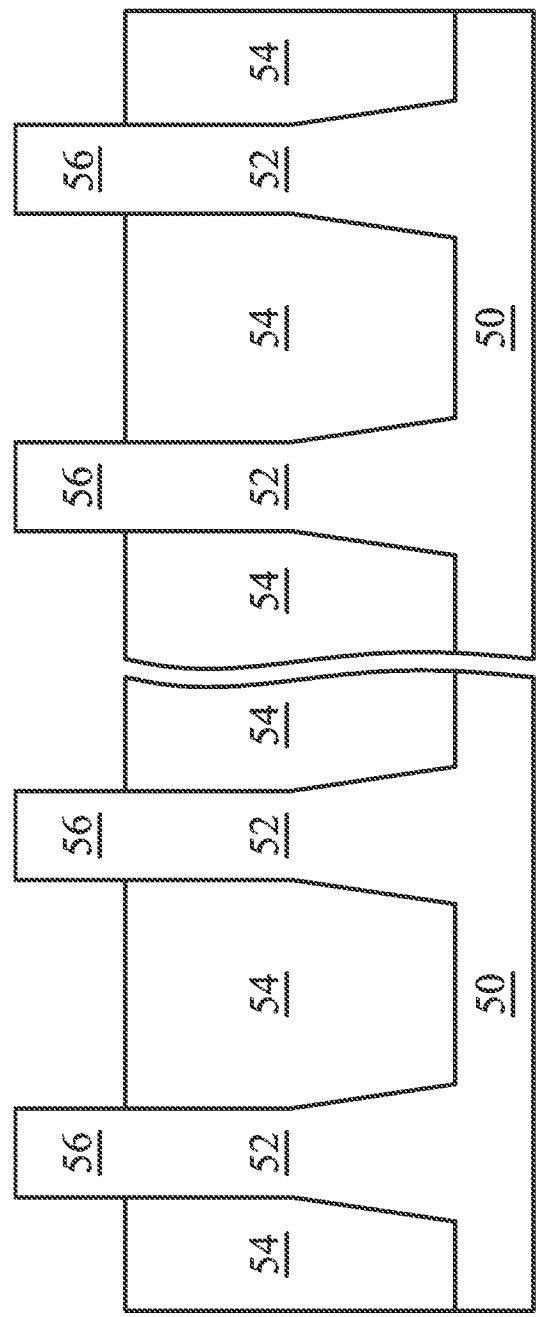
Figure 13C:
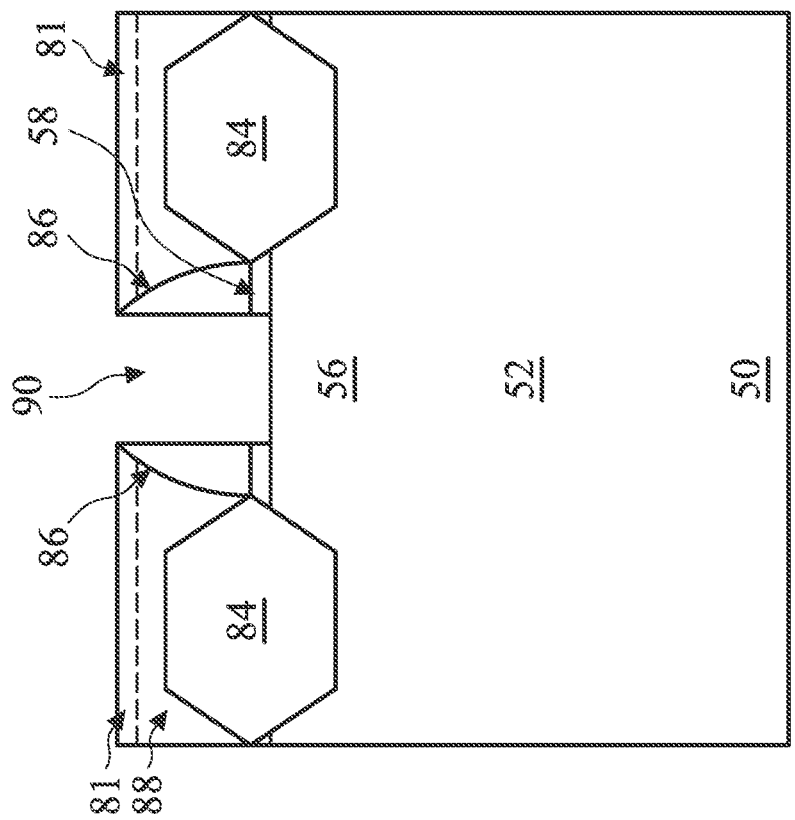
Figure 13B:
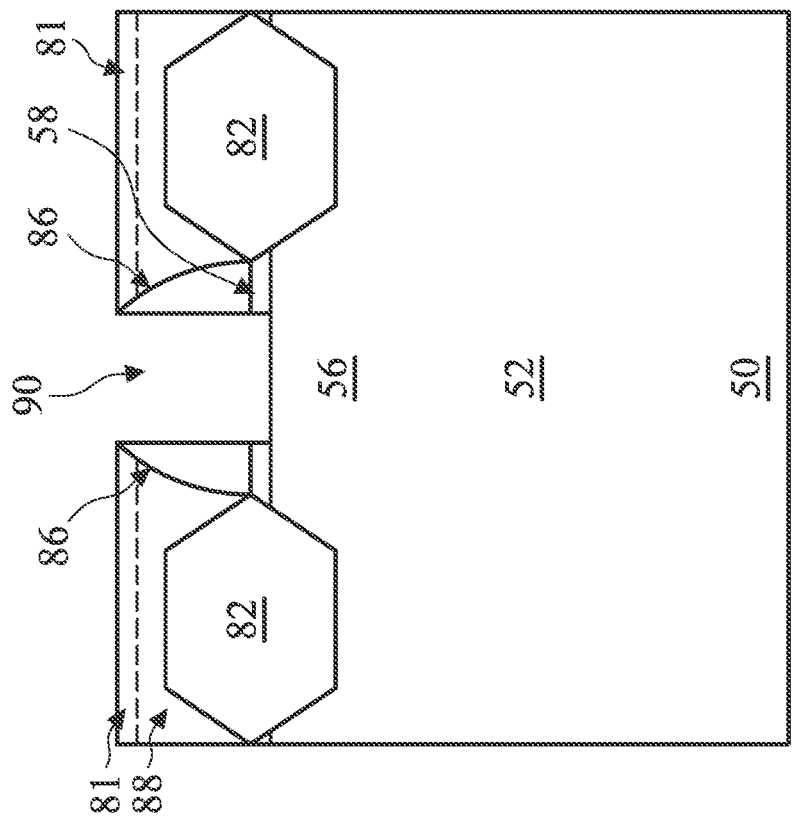

FIG. 12E illustrates a process for reducing or eliminating further dishing or erosion of ILD 88 during subsequent process steps. As shown schematically, a process 79 is performed on ILD 88 to improve a desired etch performance of ILD 88 relative to a subsequently performed etch process. For instance, process 79 can increase the etch resistivity of ILD 88 to etch processes and chemistries that are subsequently applied to remove dummy gates 70 and 70'. In one embodiment, process 79 is an implant process wherein an elemental species such as silicon is implanted into ILD 88. While not wishing to be bound to any particular underlying theory, it is believed that implanting silicon into ILD 88 improves its etch resistivity by making a region 81 that is rich in Si—Si bonds, and further believed that such Si—Si bonds improve the etch performance characteristics (resistance to etching) of ILD 88. It has been found that temperature and implant dosage can be tuned to alter the etch rate of ILD 88 after process 79 is performed. In an embodiment, silicon is implanted at an implant energy of from about 1 keV to about 80 keV to a concentration from about $1E^{13}$ atoms/cm$^2$ to about $1E^{17}$ atoms/cm$^2$. The temperature for the implant process can range from about −60 C to about 500 C. In one embodiment, the temperature ranges from about 25 C to about 450 C. It is believed that a higher temperature, around 450 C, provides a higher resulting concentration of Si—Si bonds. At an implant energy of 1.1 KeV, region 81 extends from the top surface of ILD 88 down about 35 Angstroms. For a 2.2 KeV implant energy, region 81 extends down about 54 Angstroms, and for a 3.8 KeV implant energy, region 81 extends down about 1220 Angstroms. One skilled in the art will be able to tune the implant parameters to achieve a desired etch characteristic, which depends in part upon the polysilicon etch process to be subsequently performed and how likely they are to impact ILD 88.

In other embodiments, a different species or impurity could be employed to change the etch characteristics of ILD 88. Phosphorous, for instance could be employed, as could Boron, as examples. Other elemental species and combinations of species are within the contemplated scope of the present disclosure. Other processes such as plasma treatment, annealing, curing, and the like in addition to or in lieu of process 79 are also within the contemplated scope of the present disclosure.

In the above-illustrated embodiment, the ILD 88 is processed after planarizing sacrificial material 77, which planarizing causes some, but acceptable levels of, dishing or erosion. It is within the contemplated scope of the disclosed embodiments that the ILD 88 could be processed before depositing sacrificial material 88 so that the planarizing process causes even less dishing of the ILD 88.

Returning to the perspective illustrated in FIGS. 2-11, FIGS. 13A, 13, and 13C, illustrate that the dummy gates 70 (including 70 and 70' of FIG. 12E) and 76, gate seal spacers 80, and portions of the dummy dielectric layer 58 directly underlying the dummy gates 70 and 76 are removed in an etching step(s), so that recesses 90 are formed. ILD 88 having regions 81 is minimally eroded, etched, dished or otherwise impacted by this etching step. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched.

The dummy dielectric layer 58 and gate seal spacers 80 may then be removed after the removal of the dummy gates 70 and 76.

Figure 14A:
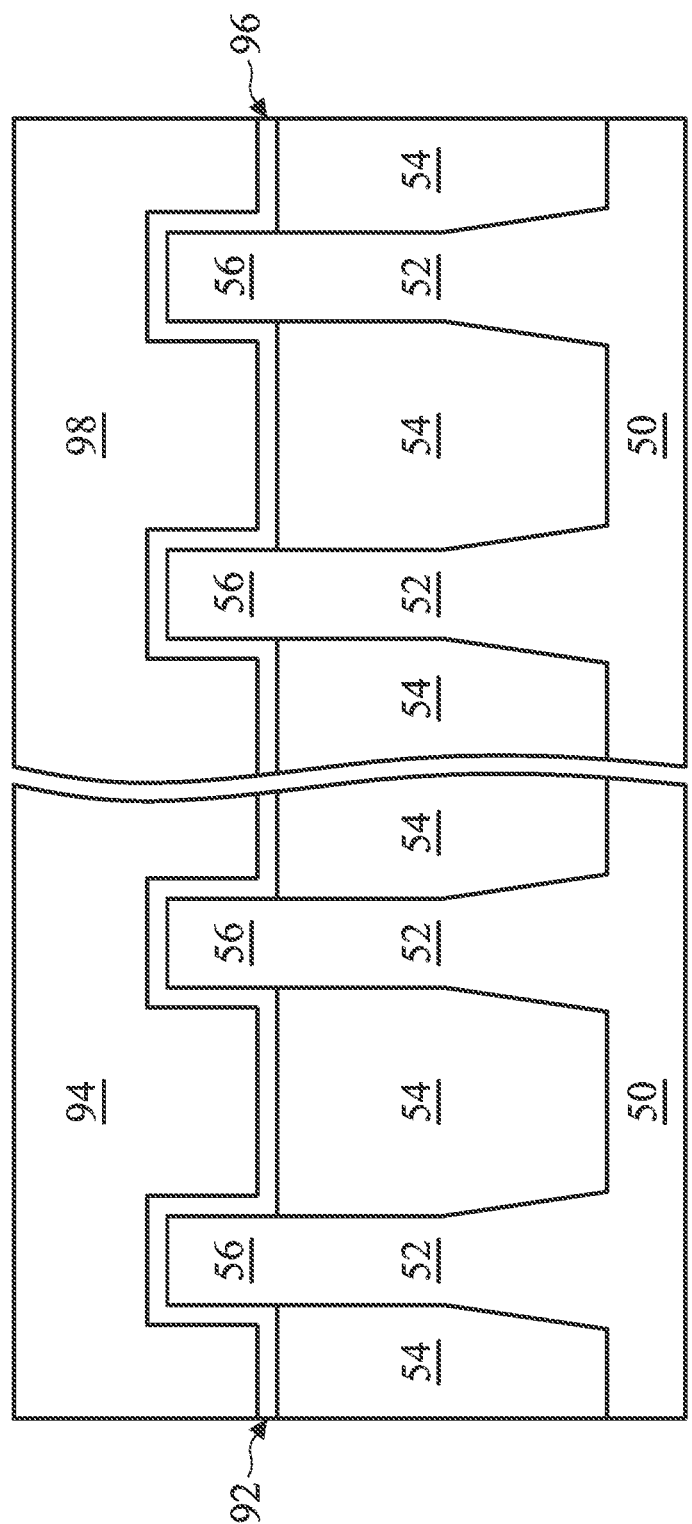
Figure 14C:
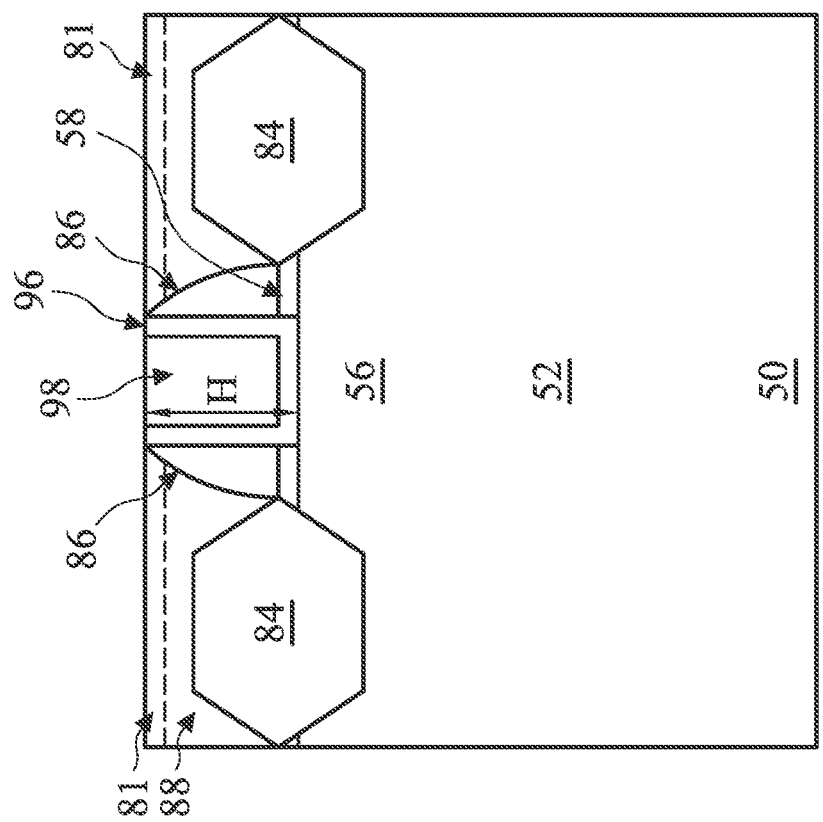
Figure 14B:
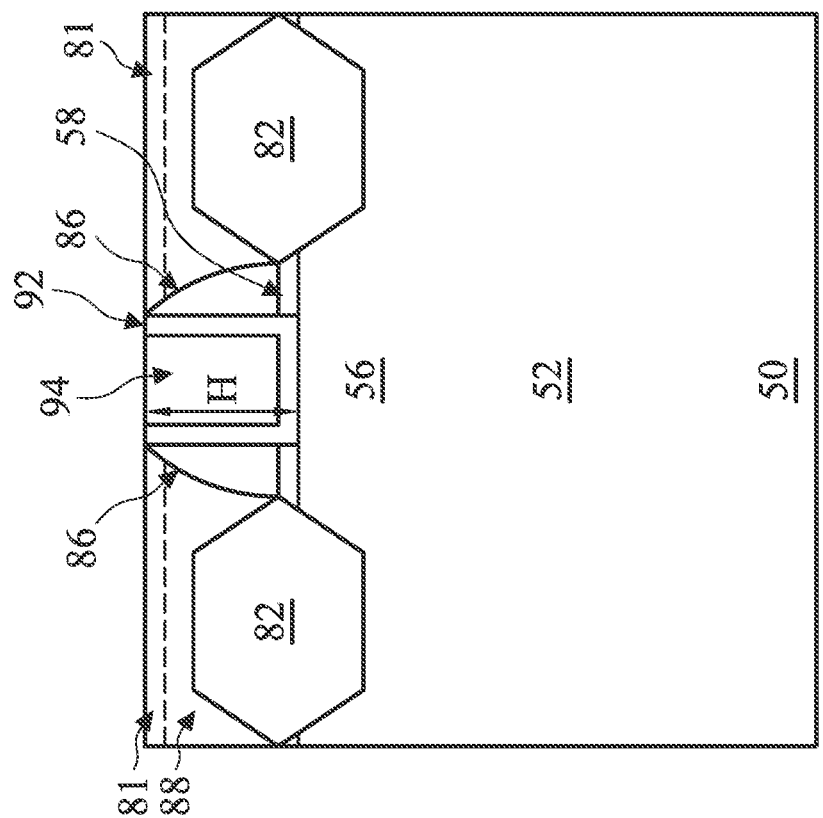

In FIGS. 14A, 14B, and 14C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting FinFETs. Note that, because dishing or erosion of ILD 88 is reduced, minimized or eliminated for processes after process 79, ILD 88 has a relatively consistent height throughout and hence the heights of resulting gate electrodes 94 and 98 are relatively consistent and uniform between transistors and across the length of fin(s) 56. This uniformity in gate height improves device performance and reliability The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 15A:
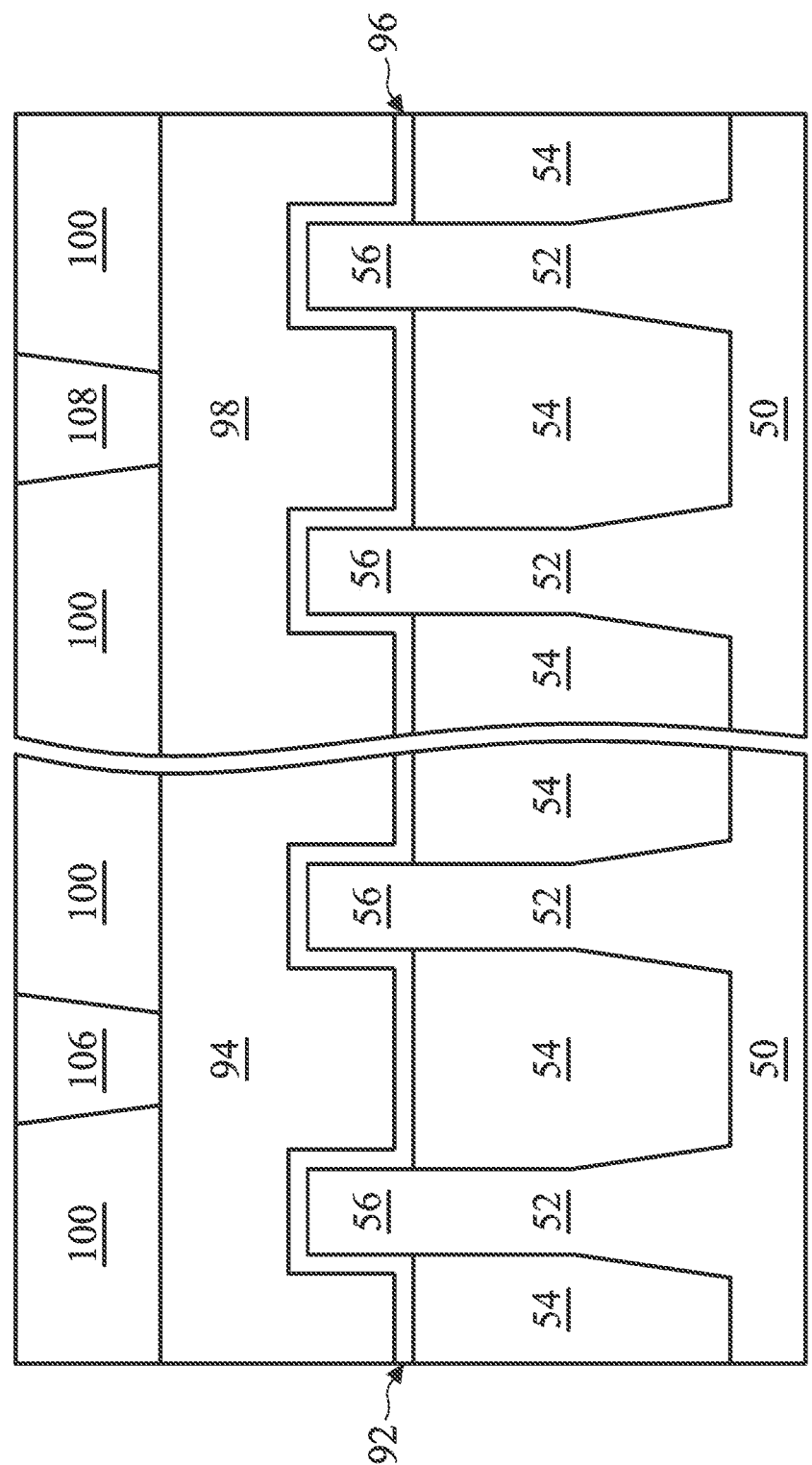
Figure 15C:
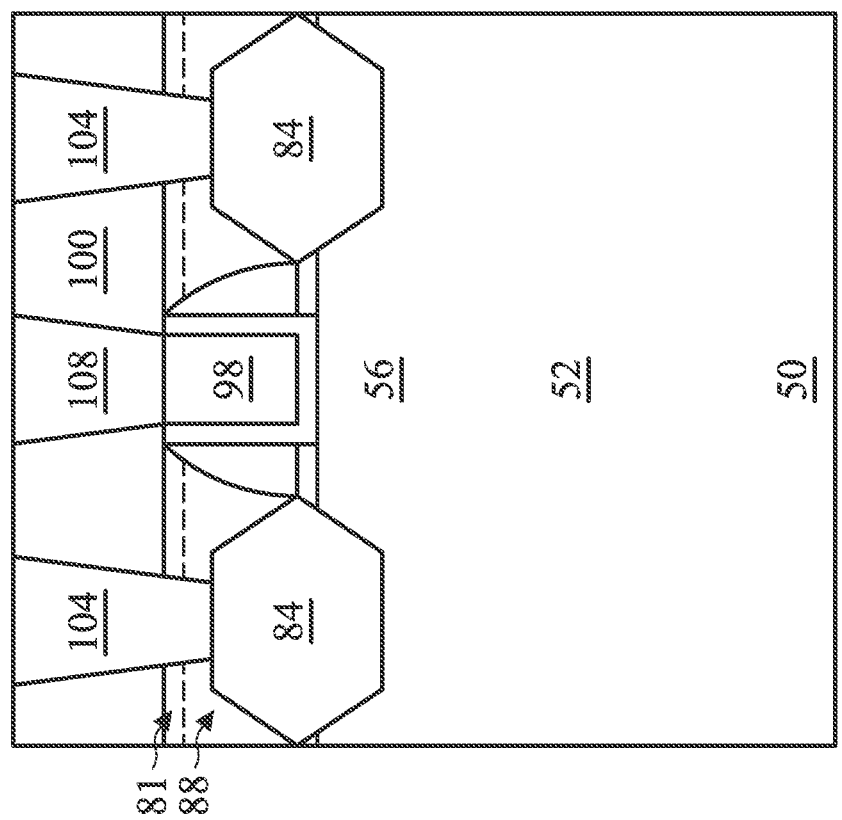
Figure 15B:
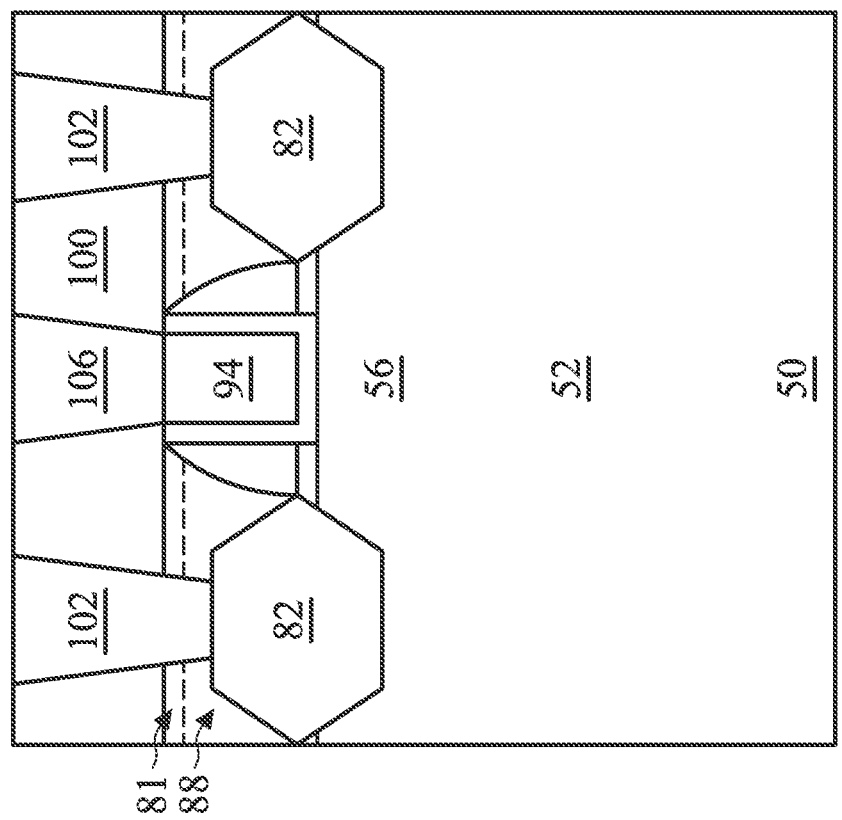

In FIGS. 15A, 15B, and 15C, an ILD 100 is deposited over ILD 88. Further illustrated in FIGS. 15A, 15B, and 15C, contacts 102 and 104 are formed through ILD 100 and ILD 88 and contacts 106 and 108 are formed through ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. Openings for contacts 106 and 108 are formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to the gate electrode 94, and contact 108 is physically and electrically coupled to the gate electrode 98.

Although not explicitly shown, a person having ordinary skill in the art will readily understand that further processing steps may be performed on the structure in FIGS. 15A, 15B, and 15C. For example, various IMDs and their corresponding metallization may be formed over ILD 100.

Figure 16:
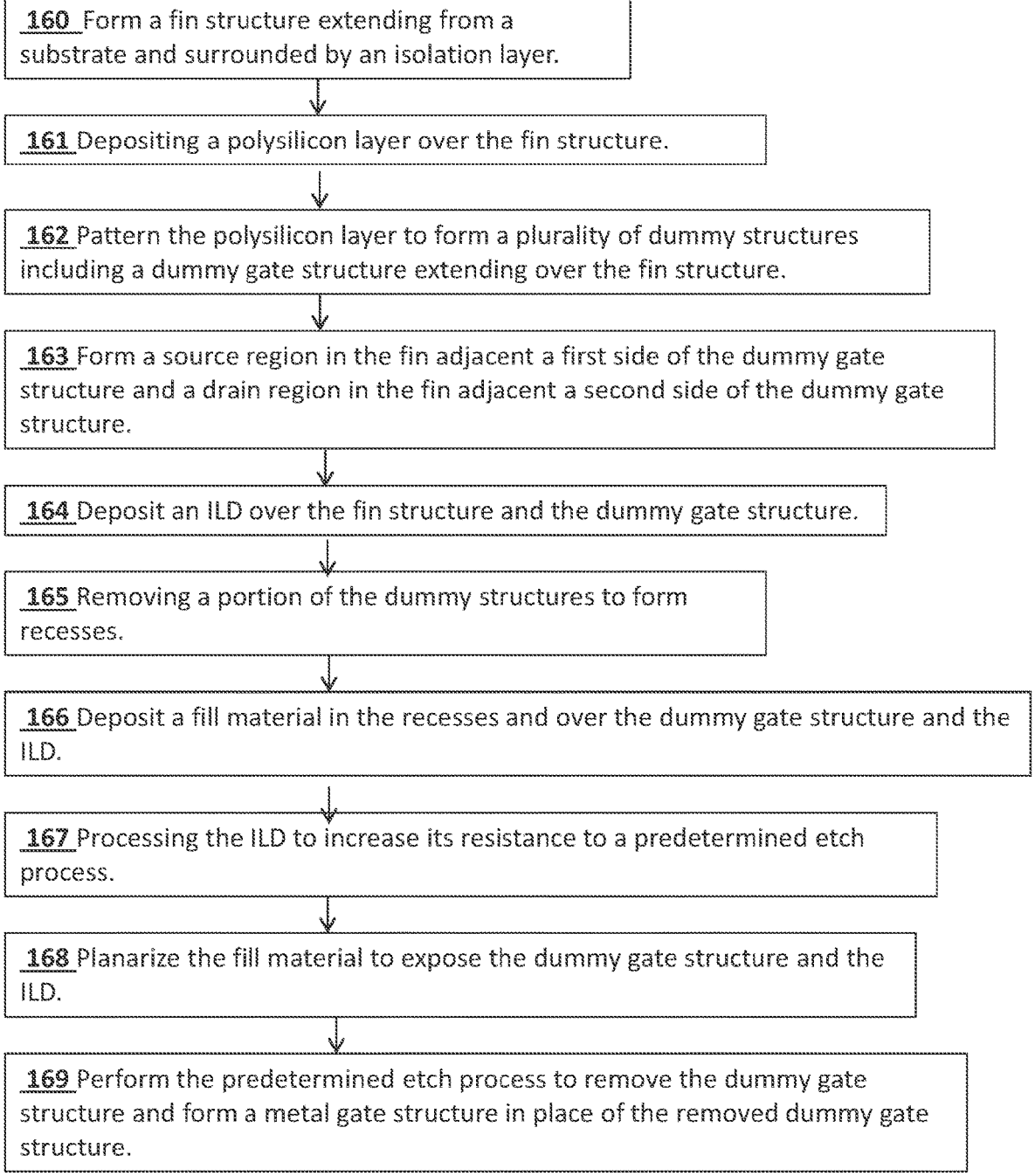
FIG. 16 is flow chart illustrating steps of an embodiment process.

FIG. 16 is a flow chart illustrating steps of a process for an embodiment. Starting with Step 160, a fin structure extending from a substrate and surrounded by an isolation layer, is formed. In step 161, a polysilicon layer is deposited over the fin structure. The polysilicon layer is patterned to form a plurality of dummy structures including a dummy gate structure extending over the fin structure, in step 162. Step 163 includes forming a source region in the fin adjacent a first side of the dummy gate structure and a drain region in the fin adjacent a second side of the dummy gate structure. An ILD is deposited over the fin structure and the dummy gate structure in step 164. Then, in step 165, a portion of the dummy structures to form recesses, a fill material is deposited in the recesses and over the dummy gate structures, per step 166. Step 167 involves processing the ILD to increase its resistance to a predetermined etch process. In step 168, the fill material is planarized to expose the dummy gate structure. The predetermined etch process is then performed to remove the dummy gate structure, and a metal gate is formed in its place, per step 169. Other steps preceding, succeeding or intervening the steps illustrated in FIG. 16 are also within the contemplated scope of this embodiment.

FIG. 17 is a flow chart illustrating another embodiment process, wherein an intermediate transistor structure having a dummy gate structure is formed on a substrate, as described in step 170. Then a dielectric layer is deposited over the transistor structure and the dummy gate structure, step 171. At least one process is performed on the dielectric layer to improve its etch resistivity to a predetermined etch process at step 172. Then at step 173, the dummy gate structure is removed using the predetermined etch process. Other steps preceding, succeeding or intervening the steps illustrated in FIG. 17 are also within the contemplated scope of this embodiment.

One general aspect of embodiments described herein includes a method, including: forming an intermediate transistor structure on a substrate, the intermediate transistor structure including a dummy gate structure; depositing a dielectric layer over the transistor structure and the dummy gate structure; performing at least one process on the dielectric layer to improve a desired etch performance of the dielectric layer relative to a predetermined etch process; and removing the dummy gate structure using the predetermined etch process.

One general aspect of embodiments described herein includes a method, including: forming a fin structure extending from a substrate and surrounded by an isolation layer; depositing a polysilicon layer over the fin structure; patterning the polysilicon layer to form a plurality of dummy structures, the dummy structures including a dummy gate structure extending over the fin structure; forming a source region in the fin adjacent a first side of the dummy gate structure and a drain region in the fin adjacent a second side of the dummy gate structure; depositing an inter-level dielectric (ILD) over the fin structure and the dummy gate structure; removing a portion of the dummy structures to form recesses; depositing a fill material in the recesses and over the dummy gate structure and the ILD; planarizing the fill material to expose the dummy gate structure and the ILD; processing the ILD to increase its resistance to a predetermined etch process; performing the predetermined etch process to remove the dummy gate structure; and forming a metal gate structure in place of the removed dummy gate structure.

One general aspect of embodiments described herein includes a transistor including: a fin structure extending from a substrate and extending along a major surface of the substrate in a first direction; a metal gate extending along the major surface of the substrate in a second direction orthogonal to the first direction, the metal gate extending over a top surface and sidewalls of the fin structure; an inter-level dielectric (ILD) layer over the fin structure, the ILD layer having an opening therein in which the metal gate is formed; and a processed region in the ILD layer, the processed region extending from a topmost surface of the ILD layer into the ILD layer, the processed region being a silicon-silicon bond rich region of a silicon oxide material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin structure extending from a substrate;
   forming a first dummy gate on the fin structure;
   depositing an inter-level dielectric (ILD) layer over the fin structure and the first dummy gate;
   removing the first dummy gate and a first portion of the ILD layer to form a first recess, wherein a remaining portion of the ILD layer remains in the first recess;
   depositing a sacrificial material in the first recess; and
   planarizing the sacrificial material to expose a second portion of the ILD layer, wherein after the planarizing, the sacrificial material extends along and contacts an upper surface and sidewalls of the remaining portion of the ILD layer.

2. The method of claim 1, further comprising forming a mask layer over the second portion of the ILD layer and a second dummy gate structure formed on the fin structure, wherein the mask layer protects the second dummy gate structure and the second portion of the ILD layer from removing the first dummy gate and the first portion of the ILD layer.

3. The method of claim 2, wherein planarizing the sacrificial material planarizes the second portion of the ILD layer, the sacrificial material, and the second dummy gate structure.

4. The method of claim 3, wherein a top surface of the second portion of the ILD layer is concave after planarizing the sacrificial material.

5. The method of claim 3, further comprising performing an implant process on the second portion of the ILD layer after planarizing the sacrificial material.

6. The method of claim 5, wherein an elemental species comprising silicon, phosphorous, or boron is implanted into the second portion of the ILD layer by the implant process.

7. The method of claim 5, wherein the implant process increases a density of silicon-silicon bonds in at least a top portion of the second portion of the ILD layer.

8. A method, comprising:
   forming a first dummy gate structure and a second dummy gate structure on a substrate;
   depositing an interlayer dielectric layer surrounding the first dummy gate structure and the second dummy gate structure;
   etching the first dummy gate structure and a first portion of the interlayer dielectric layer in a first region, wherein the second dummy gate structure and a second portion of the interlayer dielectric layer in a second region remain un-etched, wherein etching the first dummy gate structure removes the first dummy gate structure, and wherein remaining portions of the interlayer dielectric layer remain in the first region after the etching;
   forming a sacrificial material surrounding the remaining portion of the interlayer dielectric layer;
   planarizing the sacrificial material; and
   etching the second dummy gate structure to remove the second dummy gate structure after planarizing the sacrificial material.

9. The method of claim 8, wherein top surfaces of the second portion of the interlayer dielectric layer are above top surfaces of the remaining portion of the interlayer dielectric layer after etching the first dummy gate structure and the interlayer dielectric layer.

10. The method of claim 8, further comprising performing a process on the interlayer dielectric layer to improve etch resistivity of the interlayer dielectric layer, wherein the process is performed before forming the sacrificial material.

11. The method of claim 8, further comprising performing a process on the interlayer dielectric layer to improve etch resistivity of the interlayer dielectric layer, wherein the process is performed after planarizing the sacrificial material and before etching the second dummy gate structure.

12. The method of claim 11, wherein planarizing the sacrificial material causes dishing in top surfaces of the second portion of the interlayer dielectric layer.

13. The method of claim 8, wherein etching the second dummy gate structure forms first recesses in the second portion of the interlayer dielectric layer, the method further comprising:
   depositing gate dielectric layers and gate electrodes in the first recesses; and
   planarizing the gate dielectric layers and the gate electrodes such that top surfaces of the gate dielectric layers and the gate electrodes are level with top surfaces of the second portion of the interlayer dielectric layer.

14. The method of claim 8, further comprising forming a mask over the second portion of the interlayer dielectric layer, wherein the mask is removed before forming the sacrificial material.

15. A method comprising:
   forming a fin structure extending from a substrate along a major surface of the substrate in a first direction;
   depositing an inter-level dielectric (ILD) layer over the fin structure;
   etching the ILD layer to form a first opening in the ILD layer, wherein a first portion of the ILD layer is un-etched, and wherein etching the ILD layer forms remaining portions of the ILD layer having top surfaces below a top surface of the first portion;
   depositing a fill material in the first opening, the fill material surrounding the remaining portions;
   performing an implant process on the ILD layer to increase a number of silicon-silicon bonds at a top surface of the ILD layer;
   after depositing the fill material, planarizing the fill material and the ILD layer;
   forming a second opening in the ILD layer; and
   forming a gate structure in the second opening.

16. The method of claim 15, wherein performing the implant process on the ILD layer reduces an etch rate of an upper region of the ILD layer.

17. The method of claim 15, wherein the implant process is performed before planarizing the fill material and the ILD layer.

18. The method of claim 15, wherein the implant process is performed after planarizing the fill material and the ILD layer.

19. The method of claim 15, wherein the implant process is performed at an implant energy from 1 keV to 80 keV, and wherein the implant process is performed to a concentration from $1E^{13}$ atoms/cm$^2$ to $1E^{17}$ atoms/cm$^2$.

20. The method of claim 15, wherein the implant process is performed at a temperature from 25° C. to about 450° C.

* * * * *